United States Patent [19]
Kitahara

[11] Patent Number: 5,568,363
[45] Date of Patent: Oct. 22, 1996

[54] SURFACE MOUNT COMPONENTS AND SEMIFINISHED PRODUCTS THEREOF

[76] Inventor: Akira Kitahara, 585-4, Kamojima, Kamojimacho, Oe-gun Tokushima, Japan

[21] Appl. No.: 419,388

[22] Filed: Apr. 10, 1995

Related U.S. Application Data

[62] Division of Ser. No. 59,547, May 12, 1993, Pat. No. 5,440, 452.

[30]  Foreign Application Priority Data

| May 12, 1992 | [JP] | Japan | 4-118727 |
| Jun. 24, 1992 | [JP] | Japan | 4-165634 |
| Dec. 11, 1992 | [JP] | Japan | 4-331579 |

[51] Int. Cl.$^6$ .................................... H01R 9/00
[52] U.S. Cl. .................. 361/773; 361/776; 361/803; 361/813; 257/676; 174/254
[58] Field of Search .................... 361/749, 767, 361/773, 776, 777, 779, 807, 809, 813; 257/666–700, 668, 723, 676, 680, 724, 688, 690; 174/254, 259, 260; 439/55, 67, 68, 69, 74, 77, 85

[56]  References Cited

U.S. PATENT DOCUMENTS

| 4,249,299 | 1/1981 | Stephens . | |
| 4,835,847 | 6/1989 | Kamperman | 29/840 |
| 5,045,914 | 9/1991 | Casto | 357/70 |

FOREIGN PATENT DOCUMENTS

| 0080041 | 6/1983 | European Pat. Off. . |
| 0435093A2 | 7/1991 | European Pat. Off. . |
| 0532898A3 | 3/1993 | European Pat. Off. . |
| 2495839 | 6/1982 | France . |
| 2088630 | 6/1982 | United Kingdom . |
| WO89/10005 | 10/1989 | WIPO . |
| WO92/05582 | 4/1992 | WIPO . |

OTHER PUBLICATIONS

IBM Technical Disclosure Bulletin, Flat Package Using Three–Layer Film, Jan., 1989, p. 119 of vol. No. 8.
Japan Abstract vol. 11, #306 (E–546) (2753), Oct. 6, 1987.
Japan Abstract vol. 12, #135 (E–604), Apr. 23, 1988.
IBM Tech., Disclosure Bulletin; vol. 31, #8, Jan. 1989; N.Y. US p. 119.
Patent Abstract of Japan, vol. 13, #550 (P–972) Dec. 8, 1989 & JP-A-12 29 228 (Hitachi Ltd).
Patent Abstract of Japan, vol. 11, #4 (E–468) (2451) Jan. 7, 1987 & JP-A-61 179 560 (Rishiyou Kogyo K.K.).

Primary Examiner—Leo P. Picard
Assistant Examiner—Y. Whang
Attorney, Agent, or Firm—Armstrong, Westerman, Hattori, McLeland & Naughton

[57]  ABSTRACT

A surface mount component comprising an IC chip, and a plurality of leads extending outward from the body of the chip. The leads are interconnected by an insulating frame at their outer ends. Each of the leads is provided in the vicinity of the portion thereof joined to the frame with an outer lead portion to be electrically connected to a wiring board. The frame is integrally connected to the chip body by bridges. When the component is mounted on the surface of the wiring board, the outer lead portion of each lead is bonded to the board by a solder layer without separating off the frame.

9 Claims, 39 Drawing Sheets

(a)

(b)

(c)

(d)

(a)

(b)

(c)

(a)

(b)

(c)

5,568,363

SURFACE MOUNT COMPONENTS AND SEMIFINISHED PRODUCTS THEREOF

This is a Divisional of application Ser. No. 08/059,547 filed May 12, 1993 now U.S. Pat. No. 5,440,452.

FIELD OF THE INVENTION

The present invention relates to surface mount components comprising a chip body having an integrated circuit incorporated therein and a plurality of leads extending outward from the chip body, and to semifinished products thereof.

BACKGROUND OF THE INVENTION

With an increase in the density of electronic components mounted on printed wiring boards in recent years, the method of mounting IC packages on the wiring board is changing over from the lead insertion method wherein a plurality of leads are inserted into holes in the wiring board predominantly to the surface mounting method wherein the outer ends of leads are soldered directly to pads (conductor pattern) formed on the surface of the wiring board.

Widely known as electronic components to be mounted on the surface of wiring boards, i.e., as surface mount components, are IC packages, such as SOPs (Small Outline Packages) or QFPs (Quad Flat Packages), which comprise an IC chip enclosed or sealed with a molded resin in the form of a package and a plurality of leads formed from a lead frame.

With IC packages, the lead pitch is becoming ever smaller as the number of pins on IC chips increases. QFPs with a lead pitch of 0.5 mm are made available recently, and further development efforts are devoted to realize lead pitches of not greater than 0.3 mm.

Under such a situation, attention has been directed to TCPs (Tape Carrier Packages) which are produced by the TAB (Tape Automated Bonding) technique.

FIGS. 63 and 64 show a TCP which comprises an IC chip 1 connected to a plurality of leads 30 formed on a film carrier tape 400, with the connections enclosed with a resin 2. Each lead has an inner lead portion 31 which is joined to a metal projection, i.e., bump 11, formed on the rear surface of the IC chip 1 in advance.

With the TCP, the plurality of leads 30 are formed by etching a copper foil affixed to the carrier tape 400, so that the lead pitch can be made smaller than is the case with QFPs and the like.

When to be mounted on the surface of a wiring board 7, the TCP is placed on the board 7 with outer lead portions 32 in register with a solder layer 73 precoating the wiring board 7, and the outer lead portions 32 are soldered to the board 7 by depressing and heating the lead portions 32 with thermocompression bonding heads 81 and thereby melting the solder layer 73.

The outer lead portion 32 is depressed by the bonding head 81 because with the TCP, the lead 30 is made of copper foil, therefore does not itself has strength like the lead of the conventional QFP, is supported only at one end, i.e., at its base end, will be positioned as deflected or raised locally or entirely and is likely to be soldered improperly.

Thus, surface mounting of the TCP essentially requires the thermocompression bonding step for the outer lead portions of the leads, consequently necessitating additional equipment including the bonding heads and maintenance of the equipment, whereas it is impossible to mount the TCP on a common wiring board along with various other surface mount components simultaneously by a collective reflow process, hence the problem that the collective reflow equipment is not usable which is predominantly employed in the prior art.

On the other hand, the so-called COG (Chip-On-Glass) technique is known for mounting the IC chip directly on the surface of the wiring board by means of bumps formed on the body of the IC chip in advance. Electronic circuits of higher density can be designed by this technique.

Nevertheless, the CPG technique also requires additional equipment including a clean room for surface mounting and maintenance thereof. Further because the IC chip body has no leads, it is impossible to subject the chip body to various tests, with the result that the packages obtained will include rejects. The joint between the IC chip and the wiring board is positioned on the underside of the chip, so that it is impossible to visually check the joint meticulously with an up-to-date camera to ensure the desired quality. This gives rise to a need to follow a cumbersome procedure for repairing or changing components. The technique is not amenable to the batch reflow process.

SUMMARY OF THE INVENTION

An object of the present invention is to provide a surface mount component which, even when having a reduced lead pitch, can be mounted on a wiring board along with other surface mount components collectively by the reflow process.

The present invention provides a surface mount component which comprises a chip body and a plurality of leads extending from the chip body and interconnected at their outer ends by an insulating connecting member, each of the leads being provided in the vicinity of the interconnection with an electrical connector portion to be joined to a wiring board, the connecting member being integrally joined to the chip body.

The component is surface-mounted on the wiring board, for example, by fixedly bonding one or both of the chip body and the connecting member, whereby the electrical connector portion of each lead is joined to the wiring board by an electroconductive bonding layer.

The present invention provides another surface mount component which comprises a chip body and a plurality of leads extending from the chip body and integrally joined at their outer ends to the chip body, each of the leads being provided in the vicinity of the joint with an electrical connector portion to be joined to a wiring board.

The component is surface-mounted on the wiring board, for example, by fixedly bonding the chip body to the wiring board, whereby the electrical connector portion of the lead is joined to the wiring board by an electroconductive bonding layer.

The term the "chip body" means an electronic component of any type having one or a plurality of integrated circuits incorporated therein and provided with a plurality of outwardly projecting leads. Such chip bodies include, for example, IC packages comprising one or a plurality of IC chips mounted on a common substrate and enclosed or sealed with resin, module packages, multi-chip modules, hybrid IC packages, etc.

The plurality of leads projecting from the chip body have their outer ends joined and fixed to the chip body directly or indirectly by means of the connecting member, so that even when made of copper foil or like thin sheet, the leads are connected in the above-mentioned manner into a structure having an enhanced structural strength.

Accordingly, the leads are free of the likelihood of being readily deformed by a slight external force, therefore retain their shape with high accuracy and remain in position without being raised.

When the surface mount component of the invention is mounted on a wiring board by fixing the chip body to the wiring board, the electrical connector portion of each lead is pressed into contact with an electroconductive bonding layer on the board at the same time, and is held in this state owing to the above-mentioned structural strength.

More specifically, the conductive bonding layer on the wiring board is solder. The component is placed in position on the board along with QFPs or like other surface mount components which are to be mounted on the same board, and the wiring board is then heat-treated in a reflow furnace, whereby the solder is melted to solder the leads of all the surface mount components to the board at the same time.

With the surface mount component of the present invention, the plurality of leads are formed, for example, by etching copper foil or like thin sheet. Even if the leads of reduced pitch are formed, the present component can be mounted on a wiring board along with other surface mount components collectively by the reflow process.

DETAILED DESCRIPTION OF EMBODIMENTS

Figure 1:
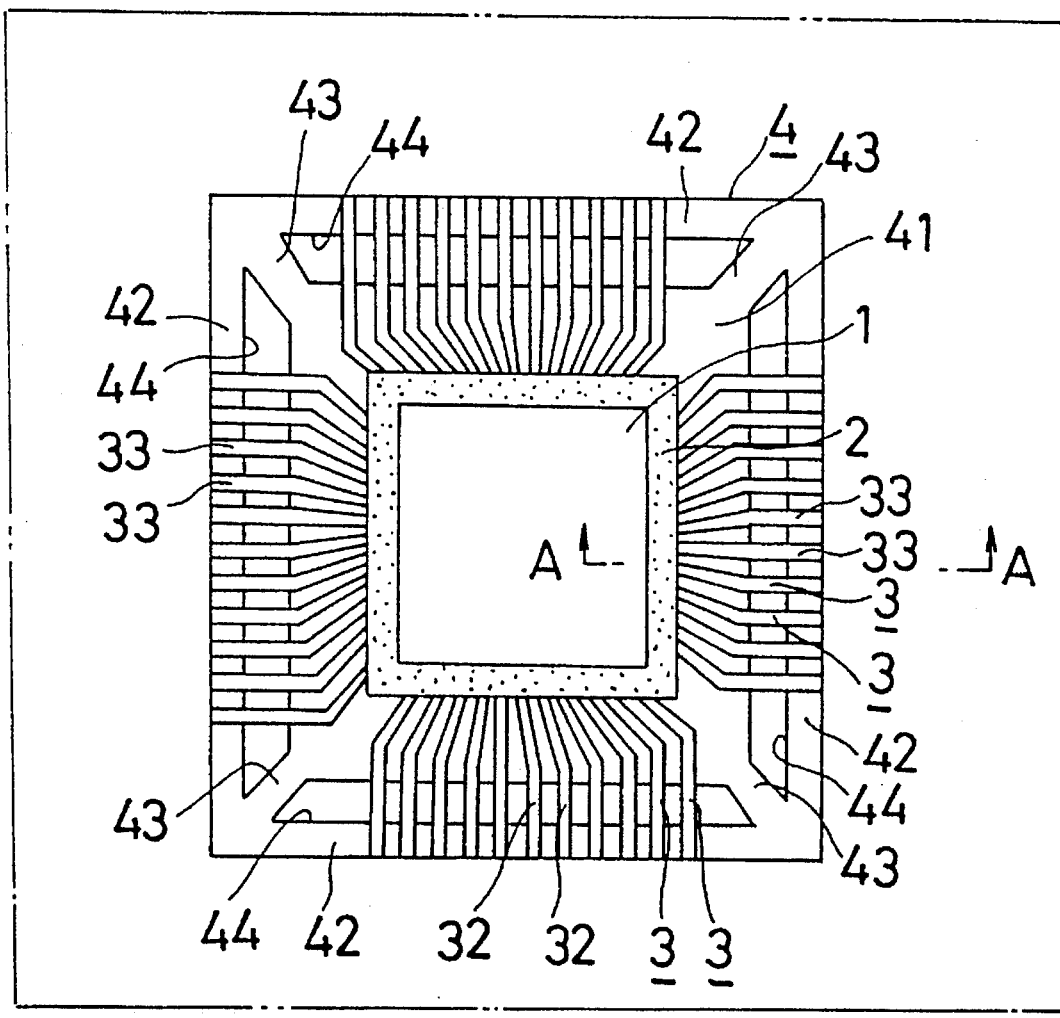
FIG. 1 is a plan view of a surface mount component of the invention.
Figure 2:
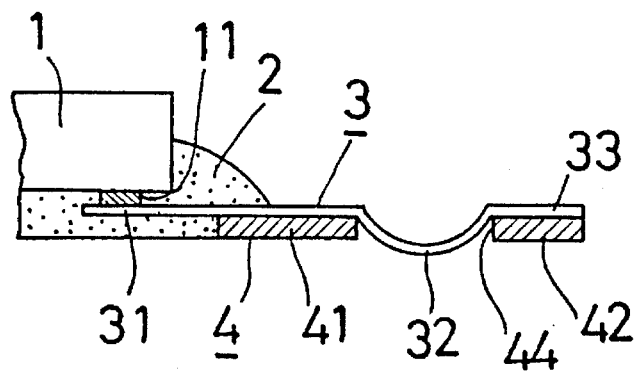
FIG. 2 is a front view along the line A—A in FIG. 1 and partly broken away to show the surface mount component.

Embodiments of the present invention will be described below in detail with reference to the drawings. In FIGS. 2 to 11 showing several embodiments in section, each surface mount component is to be mounted in the illustrated posture onto a wiring board (not shown) therebelow. The connecting member 43 shown in FIG. 1 is not illustrated when positioned behind the section. The sealing resin 2 shown in FIG. 2 is shown only in typical drawings of FIGS. 3 to 10 and omitted from the other drawings of these figures.

FIGS. 1 and 2 show a surface mount component produced by the process to be described below which is a modification of the conventional process for producing TCPs. The component comprises an IC chip 1 and a plurality of copper foil leads 3 extending from the periphery of the chip 1 outward in four directions and affixed to a support film 4 comprising a polyimide substrate, glass-epoxy substrate or the like. Each lead 3 has an inner lead portion 31 connected to a bump 11 on the IC chip 1, and the connected portion is sealed with a resin 2.

Four outer windows 44 extending along the four sides of the support film 4 are formed in the film 4 along the outer periphery thereof. The outer lead portions 32 of the leads 3 extending in the same direction are left exposed to a wiring board 7 by the outer window 44.

Within the outer window 44, the outer lead portion 32 of each lead 3 is in a circular-arc form bulging toward the wiring board 7. The top of the circular-arc portion slightly projects from the outer window 44 toward the wiring board 7.

With the surface mount component described, the outer ends 33 of all leads 3 are secured to a frame 42 providing the outer periphery of the support film 4. The frame 42 is integrally connected to a central base 41 by four bridges 43. The base 41 is joined to the IC chip 1 with the sealing resin 2.

Consequently, the leads 3 are reinforced by the support film 4, which ensures that the outer lead portions 32 are accurately positioned relative to the IC chips 1.

Further after the component has been surface-mounted on the wiring board, the solder joints of the outer lead portions 32 can be checked through the outer windows 44 with a camera. This assures the solder joints of the desired quality.

Figure 12:
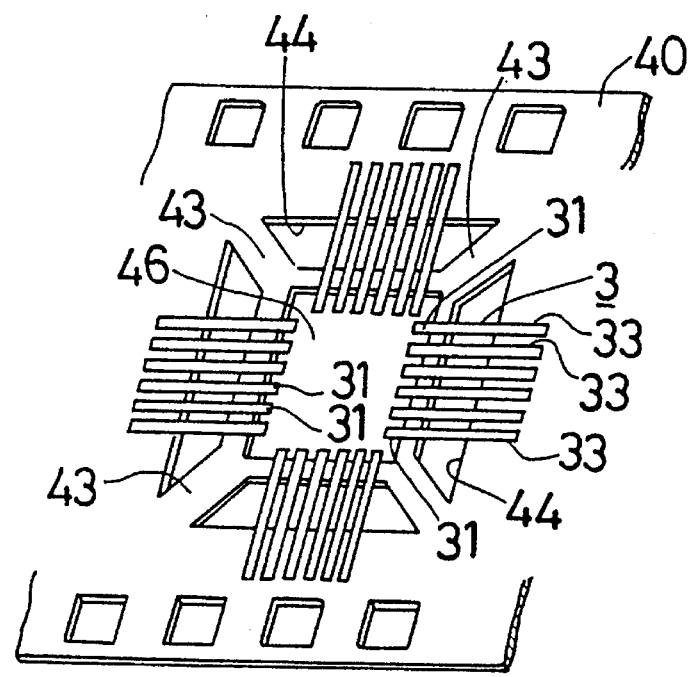
FIG. 12 is a perspective view showing the first step of a process for producing a surface mount component of the invention.
Figure 13:
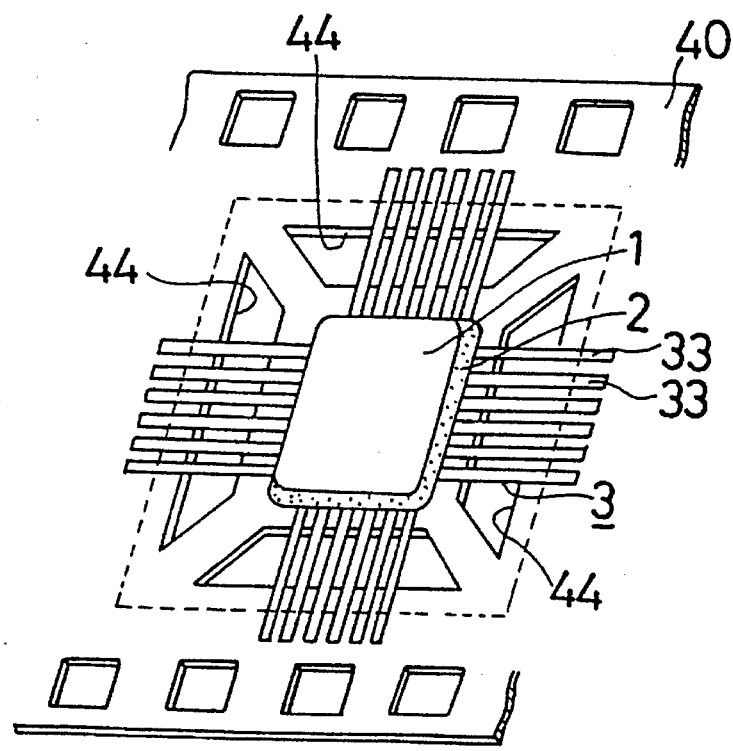
FIG. 13 is a perspective view showing the second step of the process.
Figure 14:
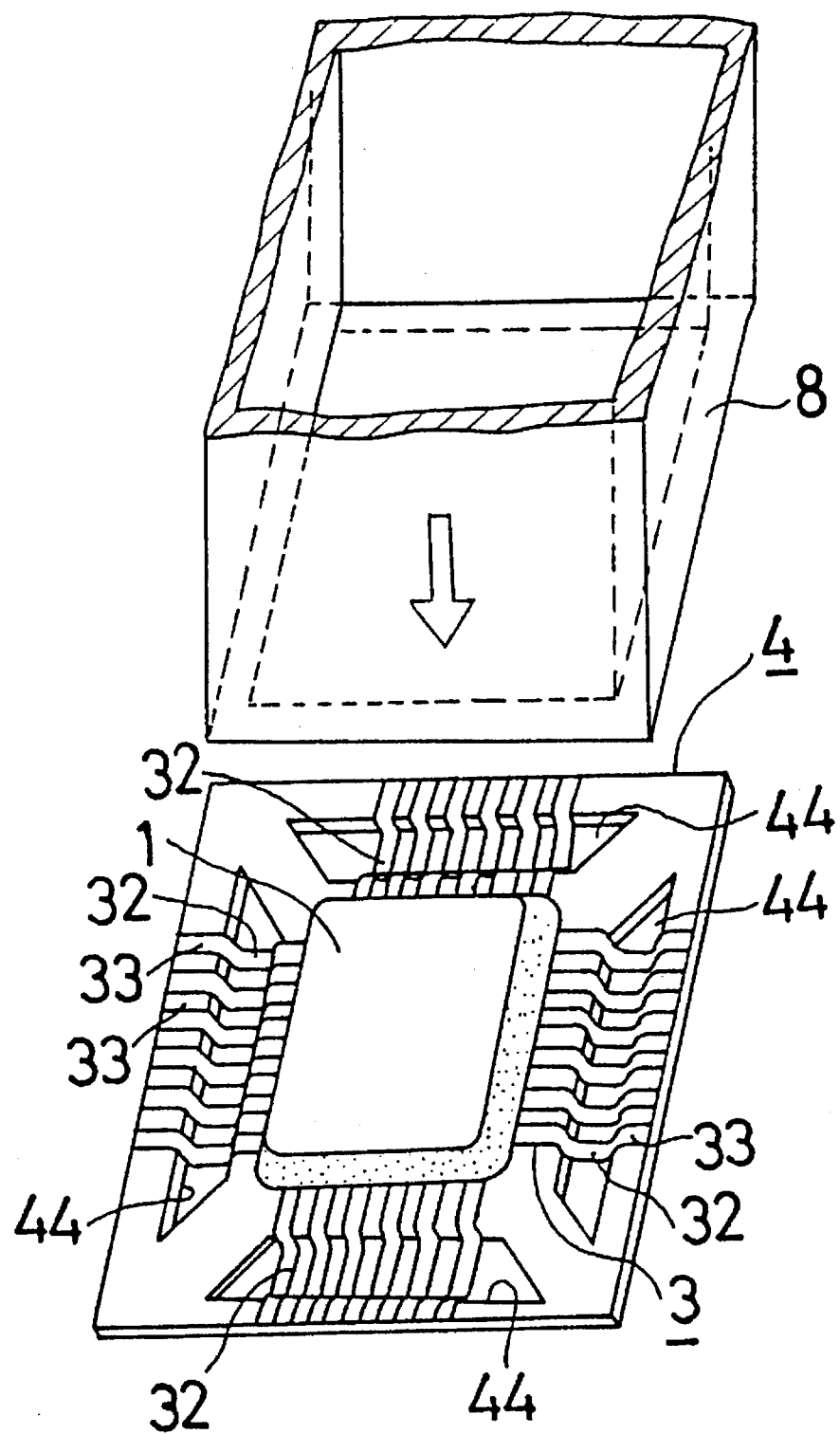
FIG. 14 is a perspective view showing the third step of the process.

The surface mount component is produced by the process shown in FIGS. 12 to 14.

First with reference to FIG. 12, an inner window 46 is formed in a carrier tape 40 in the form of a polyimide film, four outer windows 44 are formed in the tape around the inner window 46, and leads 3 extending from the inner window 46 outward in four directions are formed.

The leads 3 are formed by the same process as is the case with conventional TCPs. More specifically, the illustrated lead pattern is formed by affixing a copper foil to the surface of the carrier tape 40 having the inner window 46 and the outer windows 44 formed therein, and thereafter etching the copper foil.

The leads 3, which are formed by etching the copper foil, can alternatively be formed, for example, by tin plating.

Next as shown in FIG. 13, the inner leads are bonded to an IC chip 1 placed on the carrier tape 40, the bonded portions are sealed with a resin 2, and the carrier tape 40 is cut along the illustrated broken line to cut out the support film 4 shown in FIG. 14.

Subsequently, outer lead portions 32 of the leads 3 are formed to a circular-arc shape by a press 8 as shown in FIG. 14. The support film 4 has a small thickness of up to 1 mm, so that the outer lead portions 32 will not break at this time but plastically deform to stretch without permitting the lead outer ends 33 to separate off the support film 4.

Figure 15:
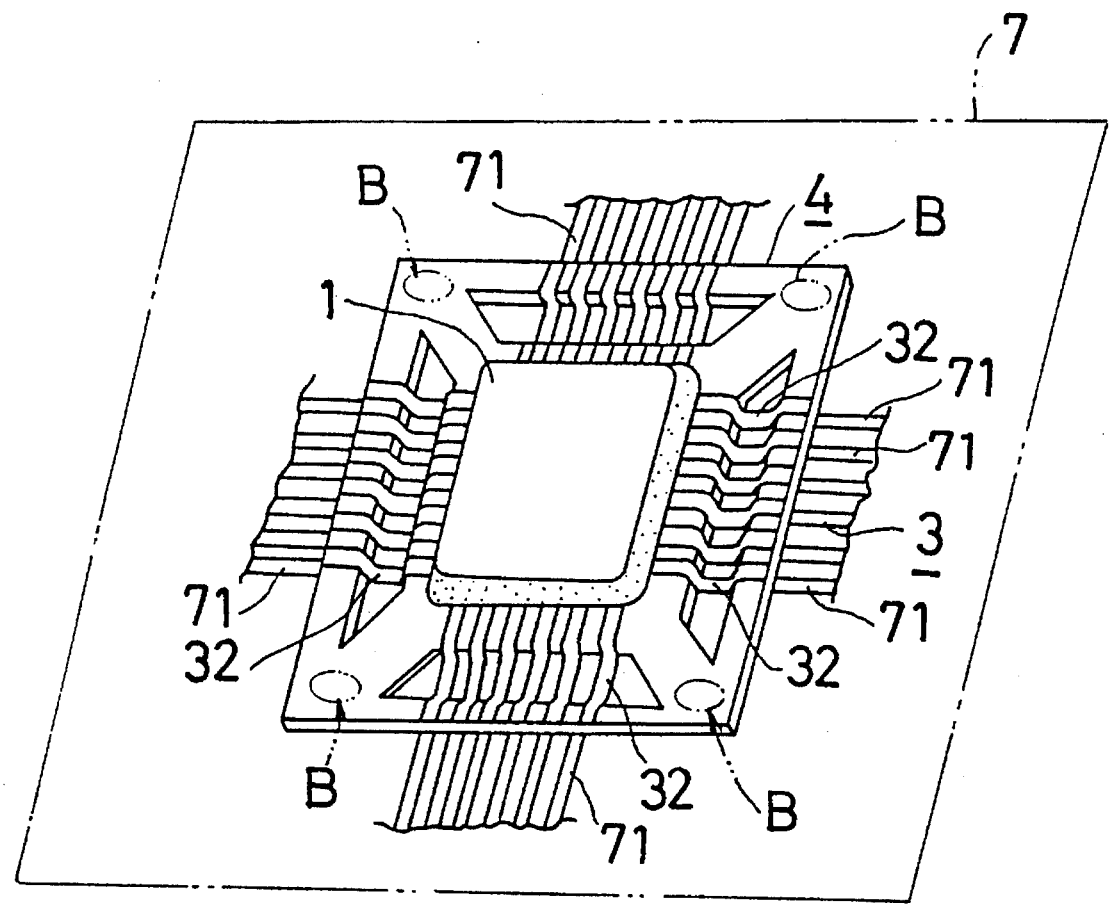
FIG. 15 is a perspective view showing the surface mount component produced by the process.
Figure 16:
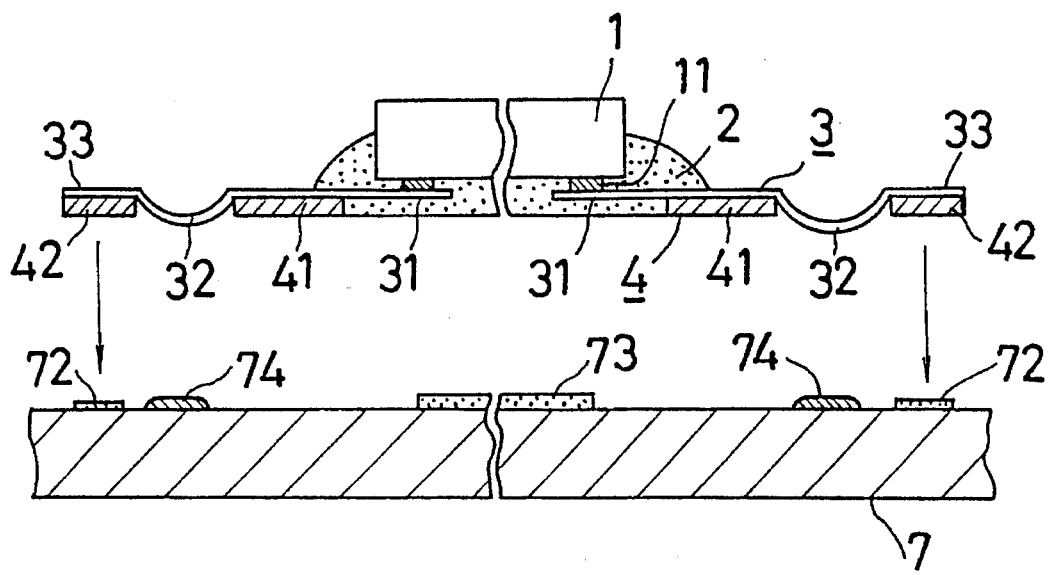
FIG. 16 is a sectional view showing how to surface-mount the component on a wiring board.
Figure 17:
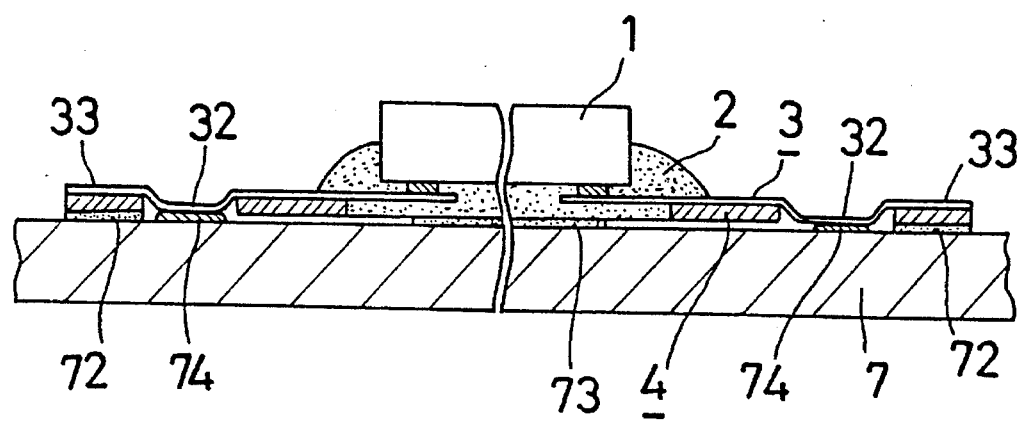
FIG. 17 is a sectional view showing the component as mounted on the surface of the wiring board.

When the surface mount component thus obtained is to be installed on a wiring board 7 as shown in FIGS. 16 and 17, four corner portions of the support film 4 indicated in broken lines in FIG. 15 serve as regions B to be bonded to the wiring board 7.

As shown in FIG. 16, the wiring board 7 is formed with an adhesive layer 72 or 73 over five regions corresponding to the four bonding regions B and the central region of the IC chip 1, and further formed with a precoat solder layer 74 at positions corresponding to the outer lead portions 32 of the leads 3. A photosetting insulating resin is suitable for forming the adhesive layers 72 and 73.

Further as in embodiments to be described later, bonding pads of copper foil may be formed on the surface of the support film 4 to be opposed to the wiring board. Solder is then usable for forming the bonding layer 72.

The surface mount component is pressed against the surface of the wiring board 7 and secured to the board 7 with the adhesive layers 72, 73 as shown in FIG. 17. At this time, the leads 3 have their outer ends 33 integrally connected to the IC chip 1 by the frame 42 of the support film 4 and are given enhanced structural strength, so that the outer lead portions 32 will not be displaced relative to the IC chip 1 but are accurately positioned on the solder layer 74 in register therewith.

When the photosetting insulating resin or solder paste is used as the material for the bonding layers 72, 73, these bonding layers shrink during solidification, exhibiting an effect to pull the component toward the wiring board 7.

When the surface mount component is thus fixedly bonded to the wiring board 7, the outer lead portions 32 of the leads 3 elastically deform slightly along the surface of the solder layer 74 as illustrated and are pressed against the solder layer 74 by their elastic repellency and held in this state by the reinforcing effect given by the frame 42 of the support film 4.

The component and other surface mount components such as QFPs as mounted on the wiring board 7 are thereafter subjected collectively to a reflow process in a reflow furnace. This process need not involve the thermocompression step for the outer lead portions although the step is conventionally indispensable to TCPs.

As a result, the leads 3 of the present component is electrically connected to a wiring pattern 71 corresponding thereto and provided on the board 7 as shown in FIG. 15.

Figure 3:
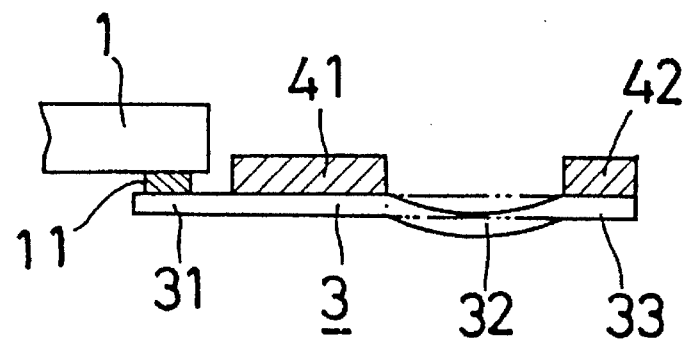
FIG. 3, (a) to (d), FIG. 4, (a) to (e), FIG. 5, (a) to (d), FIG. 6, (a) to (d), FIG. 7, (a) and (b), FIG. 8, (a) and (b), FIG. 9, (a) to (d), FIG. 10, (a) to (e) and FIG. 11, (a) and (b) are front views partly broken away, corresponding to FIG. 2 and showing other embodiments.
Figure 3:
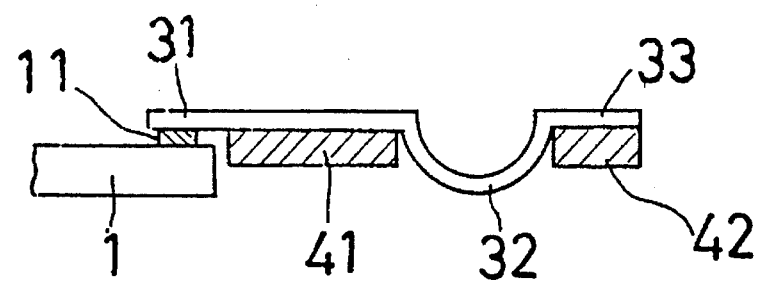
Figure 3:
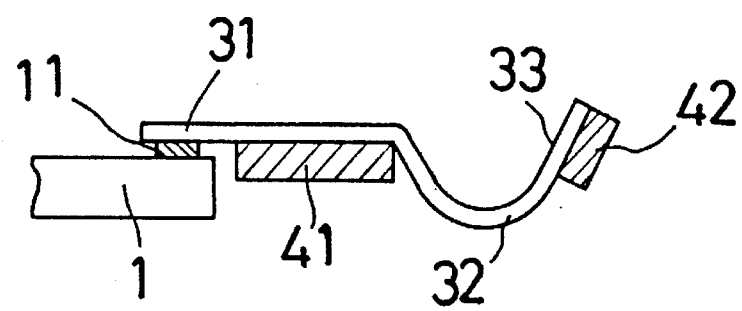
Figure 3:
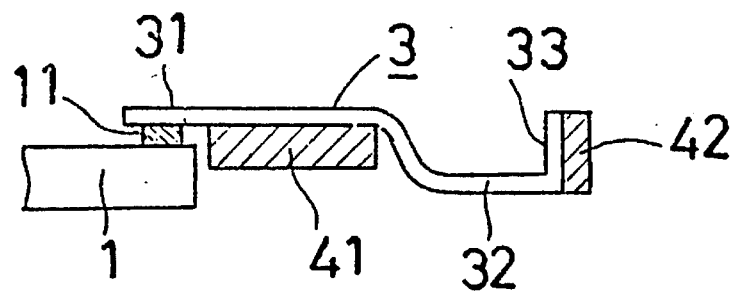

FIG. 3, (a) and (b) show modifications of the above surface mount component. These components also have the same advantage as described above.

In the case of FIG. 3, (a), each outer lead portion 32 need not always be formed to the circular-arc shape but may be straight as indicated in broken lines. In this case, as in some of the embodiments to be described later (see FIG. 6, (b), FIGS. 39 to 42 and FIGS. 47 to 49), the leads need not be worked by forming or bending, so that the outer lead portions can be finished in shape with high accuracy.

Figure 20:
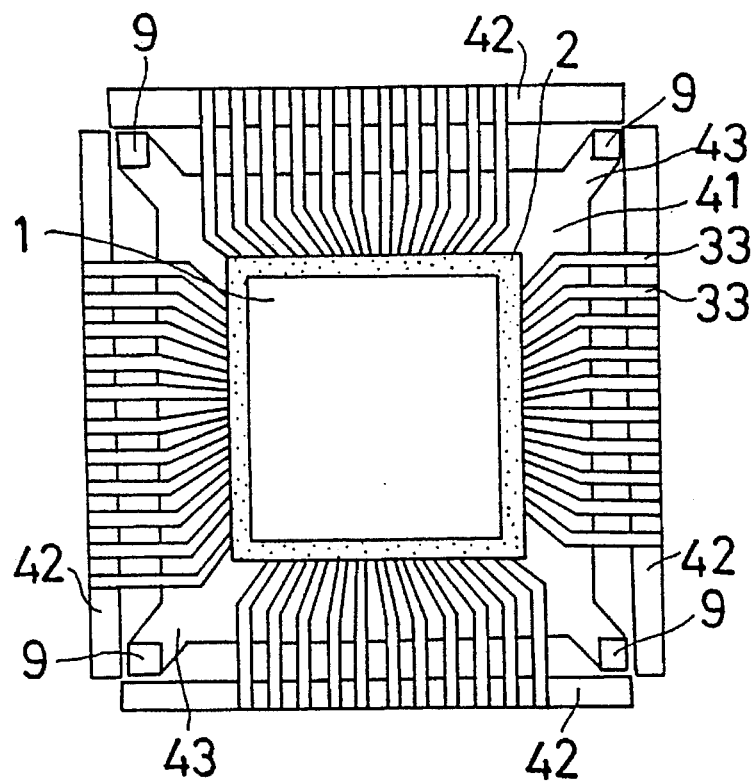
FIG. 20 is a plan view of the third step of the process.
Figure 21:
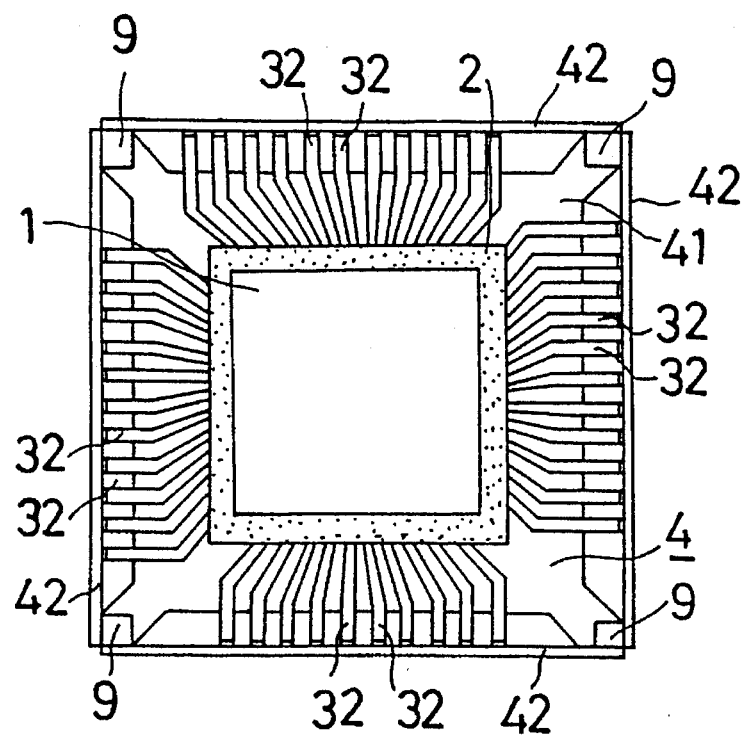
FIG. 21 is a plan view of the surface mount component completed by the above steps.

With the surface mount component shown in FIG. 21, the support film 4 has a frame 42 which is vertical to the base 41 so as to further increase the overall structural strength of the support film 4. The component is produced by the process shown in FIGS. 18 to 20.

Figure 18:
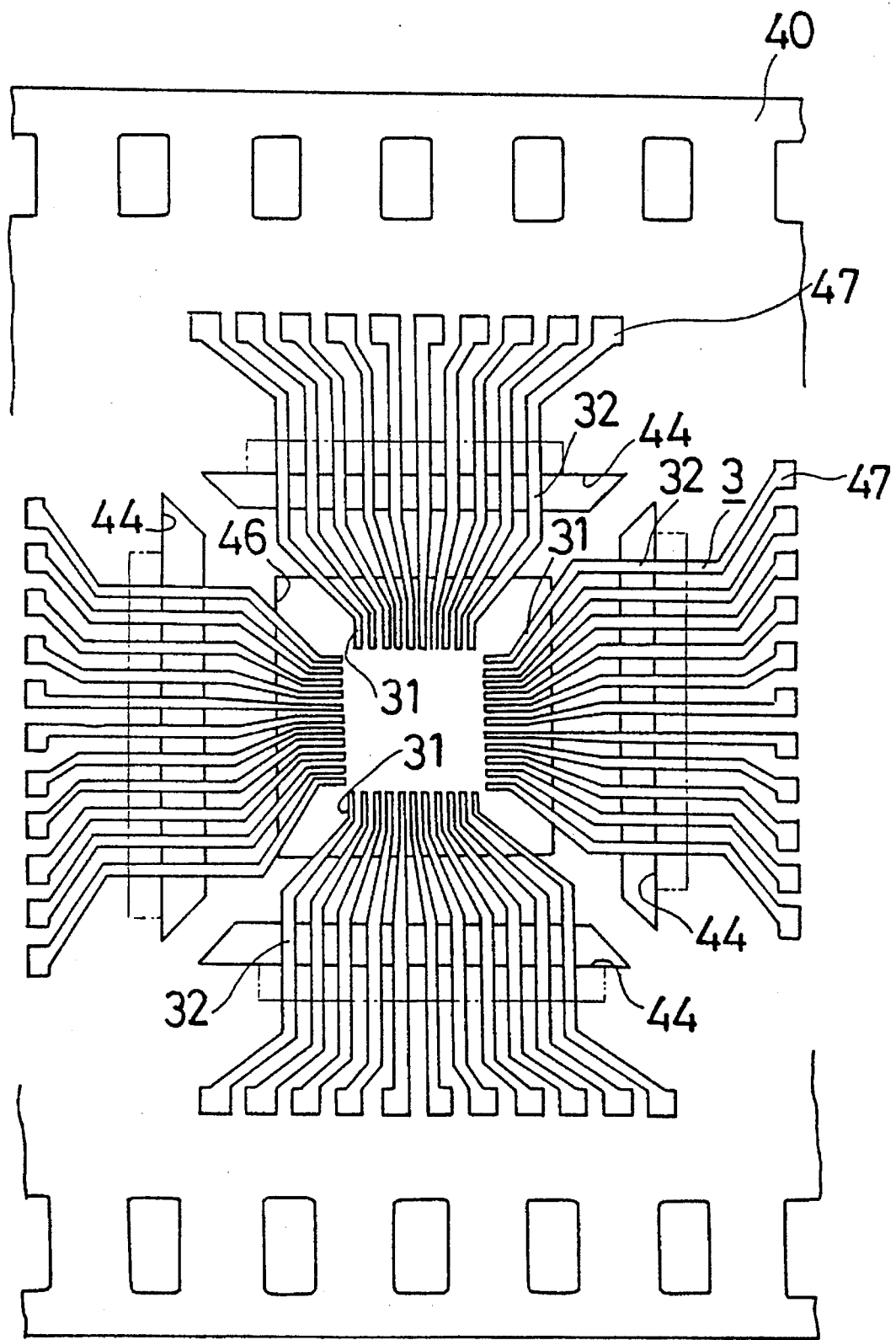
FIG. 18 is a plan view showing the second step of a process for producing another embodiment of surface mount component of the invention.

First with reference to FIG. 18, an inner window 46 and outer windows 44 are formed in a carrier tape 40, and a plurality of leads 3 are formed. Each of the leads 3 has an inner lead portion 31 projecting into the inner window 46 and an outer lead portion 32 exposed to the outer window 44. At the outer end of the lead opposite to the inner lead portion 31, the lead 3 is formed with a tester point 47 as in the conventional TCP.

When required, a solder resist is applied to the carrier tape 40 over four striplike regions indicated in broken lines in FIG. 18.

Figure 19:
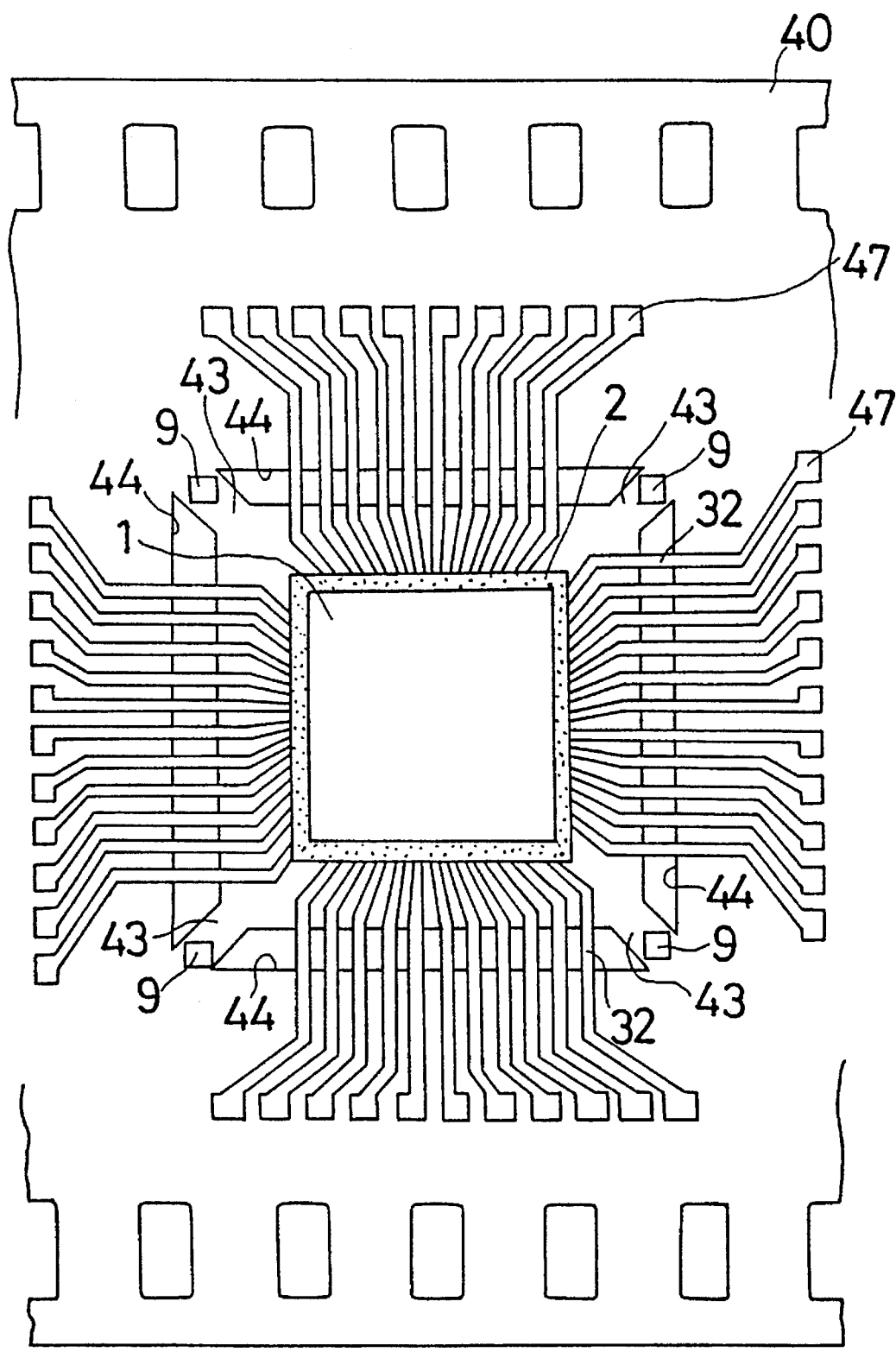
FIG. 19 is a plan view of the second step of the process.

Next as shown in FIG. 19, the inner lead portions are bonded to an IC chip 1 as placed on the carrier tape 40, and the bonded portions are sealed with resin 2.

A rectangular parallelopipedal post 9 is provided upright on each of four bridges 43 formed between the adjacent outer windows 44. The post 9 can be formed, for example, by fixedly adhering a resin molding on the surface of the bridge 43.

The carrier tape 40 is then cut to form four striplike frames 42 around the base 41 as shown in FIG. 20, each of the frames 42 interconnecting the outer ends of the leads 3 extending in the same direction. The frames 42 are separate from one another and also from the bridges 43. Each bridge 43 has the post 9 remaining thereon.

In this step, the outer lead portions 32 of the leads 3 are suitably formed.

Finally as shown in FIG. 21, each frame 42 is folded to a vertical position, and each end of the frame is fixedly adhered to a side face of the post 9. The support film 4 is now in the form of a three-dimensional structure and has an increased structural strength in its entirety.

With the surface mount component thus fabricated, the leads 3 are reliably held by the support film 4 of three-dimensional structure. This obviates the likelihood that the outer lead portions 32 will be displaced relative to the IC chip 1, eliminating the problem of rise of the leads when the component is to be surface-mounted on a wiring board.

FIG. 3, (d) shows an example of surface mount component having the above construction. The outer lead portion 32 can be formed in a circular-arc shape.

Figure 22:
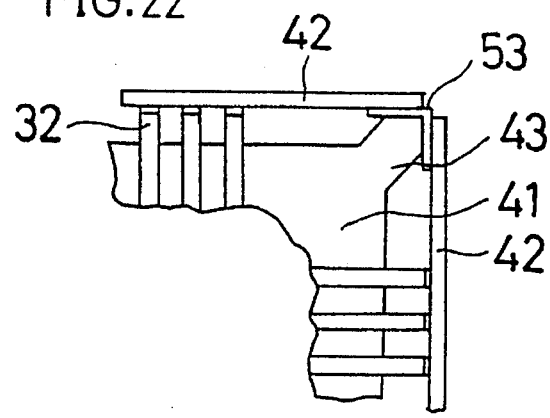
FIG. 22 is a fragmentary plan view of another embodiment.

FIG. 22 shows an embodiment wherein the posts 9 are omitted, and an adhesive tape 53 is used for inter-connecting the adjacent frames 42, 42 and for connecting these frames to the bridge 43.

Figure 23:
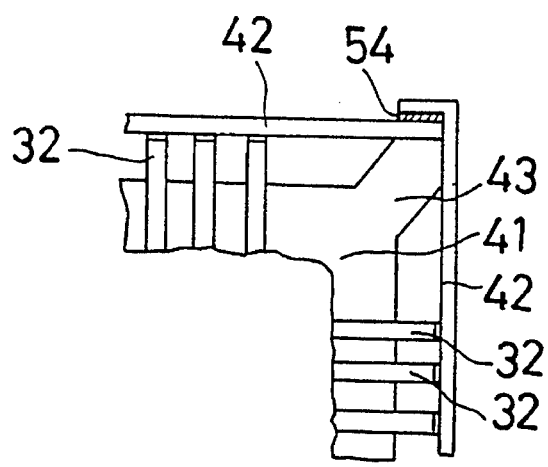
FIG. 23 is a fragmentary plan view of another embodiment.

FIG. 23 shows an embodiment wherein one of the adjacent frames 42, 42 is lapped over the other frame, and an adhesive layer 54 is used in place of the adhesive tape 53 for bonding the lapping portions together and for bonding the lap to the bridge 43.

Figure 24:
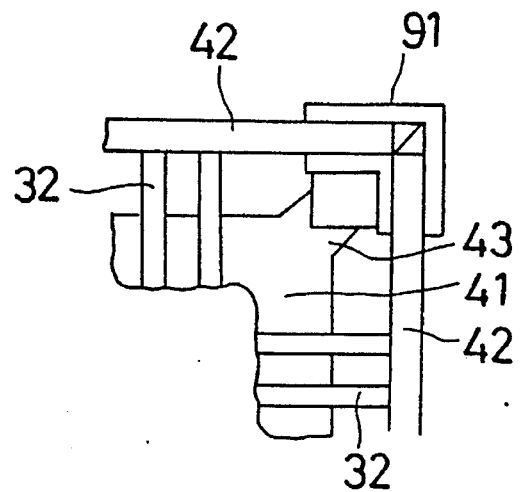
FIG. 24 is a fragmentary plan view of another embodiment.
Figure 25:
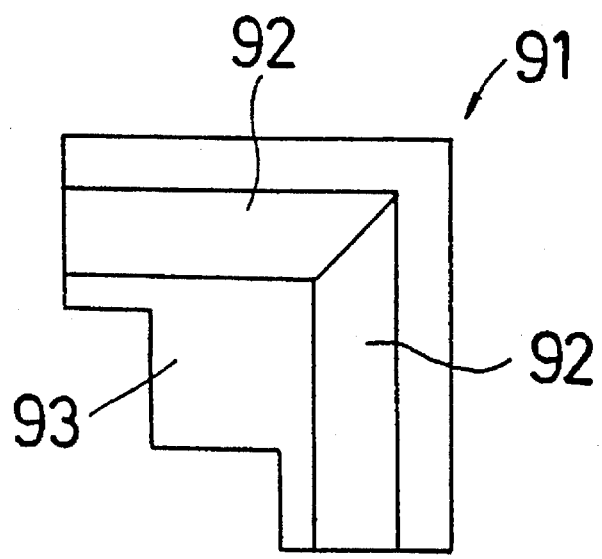
FIG. 25 is a plan view of a connecting piece for use in the embodiment of FIG. 24.
Figure 26:
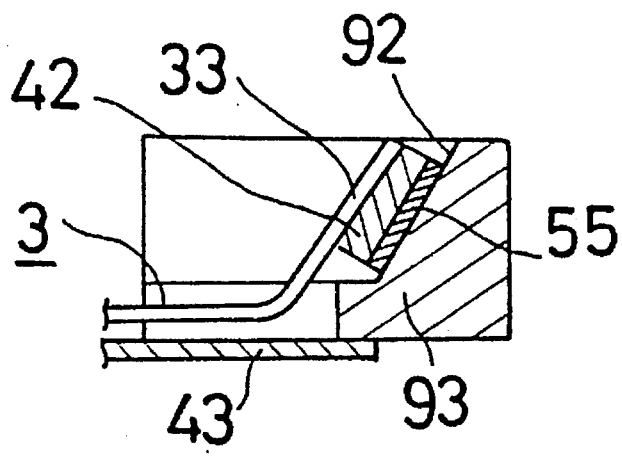
FIG. 26 is a sectional view showing another example of connecting piece.

FIG. 24 shows an embodiment wherein a connecting piece 91, for example, integrally molded of resin is used for interconnecting the adjacent frames 42, 42 and connecting these frames to the bridge 43. The connecting piece 91 comprises a base portion 93 and slanting portions 92, 92, and the frame 42 at the lead outer ends 33 is bonded to the slope of the slanting portion 92 by an adhesive layer 55 as seen in FIGS. 25 and 26.

Figure 27:
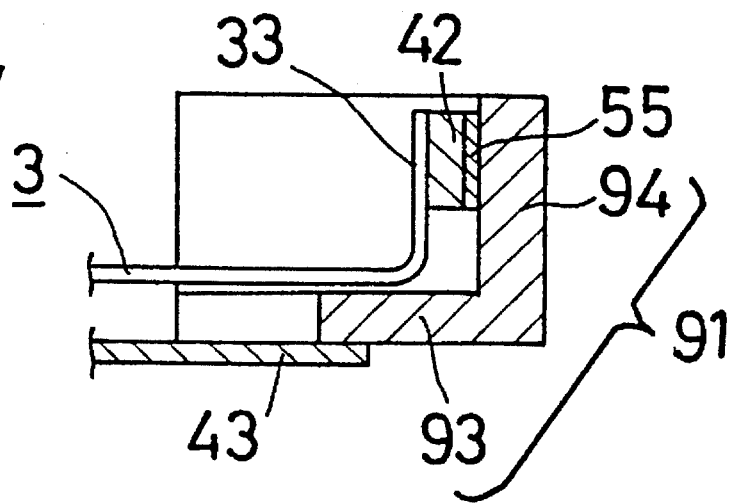
FIG. 27 is a sectional view showing another example of connecting piece.

FIG. 27 shows a connecting piece 91 which comprises a base portion 93 and a vertical wall portion 94. Lead outer ends 33 are bent vertically by the connecting piece 91.

FIG. 3, (c) and (d) show surface mount components having the same construction as the embodiments described with reference to FIGS. 18 to 27. The outer lead portion 32 can be modified variously in shape.

Figure 28:
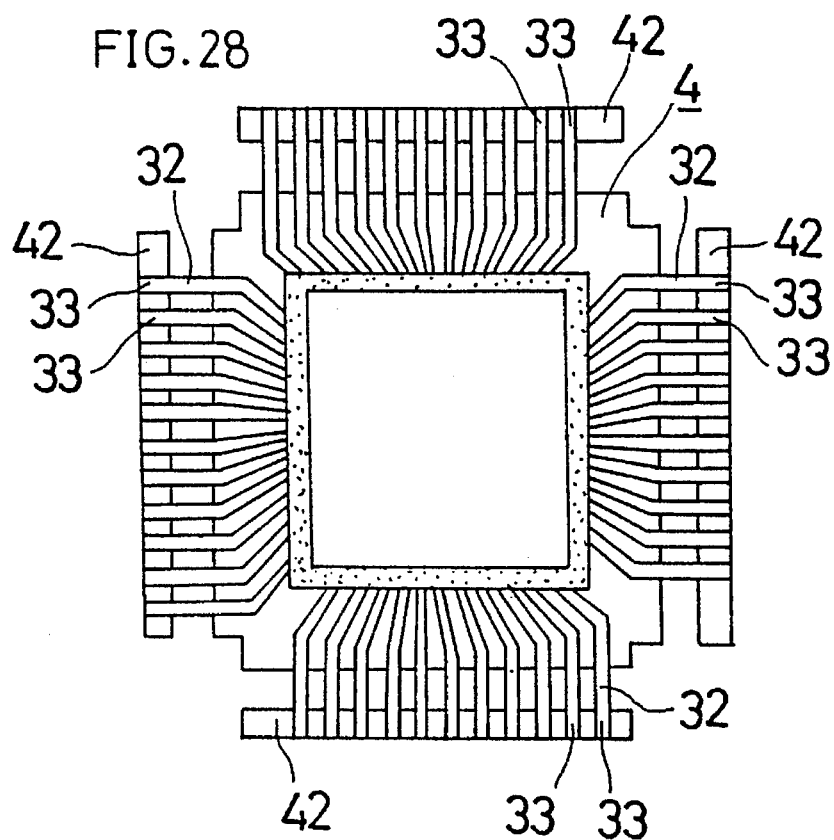
FIG. 28 is a plan view showing a semifinished product of another embodiment of surface mount component of the invention.
Figure 29:
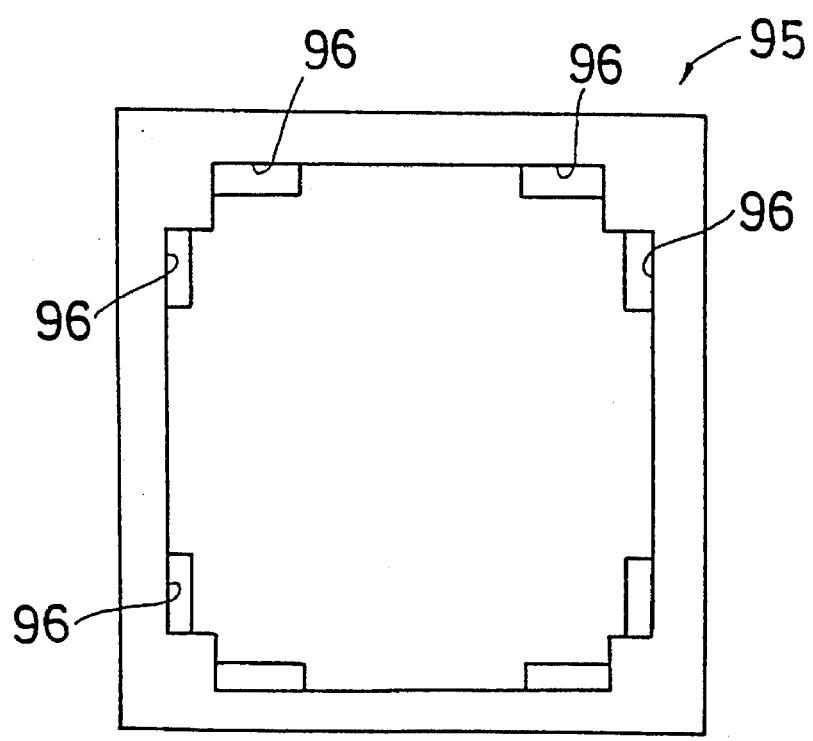
FIG. 29 is a plan view of a frame for use in the embodiment.
Figure 30:
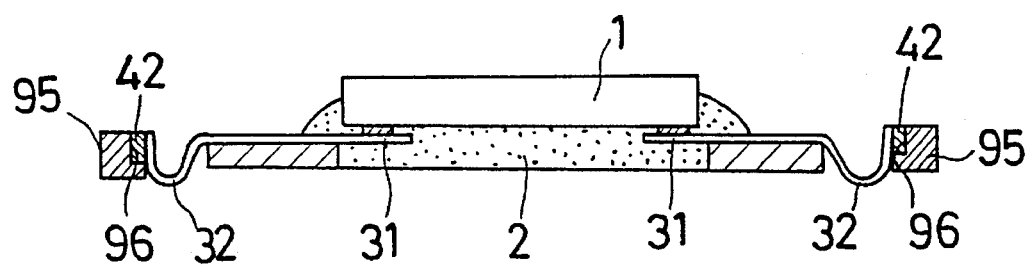
FIG. 30 is a sectional view of the embodiment as completed.

FIG. 30 shows another embodiment of surface mount component which comprises a frame member 95 shown in FIG. 29 and a semifinished product of surface mount component having four frames 42 as shown in FIG. 28 and fitted in the frame member 95.

As shown in FIG. 29, the frame member 95 is formed with vertical bearing faces 96. The four frames 42 are fixedly adhered to the vertical bearings faces 96 of the frame member 95 as shown in FIG. 30.

With the component of FIG. 30, the frame member 95 itself has a high strength, which reinforces the leads 3, ensuring that the outer lead portions 32 remain in shape with accuracy. In this case, the wiring board can be bonded to the rear side of the frame member 95.

Figure 4:
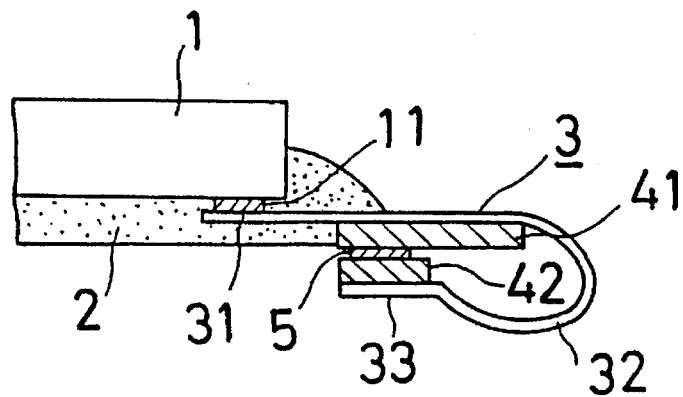
Figure 4:
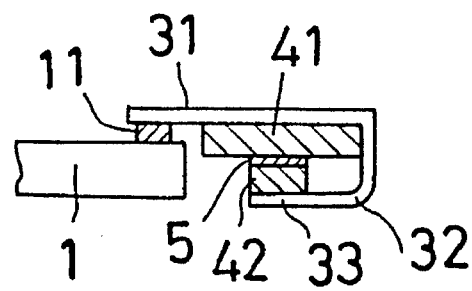
Figure 4:
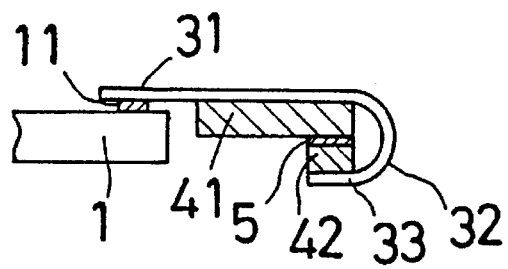
Figure 4:
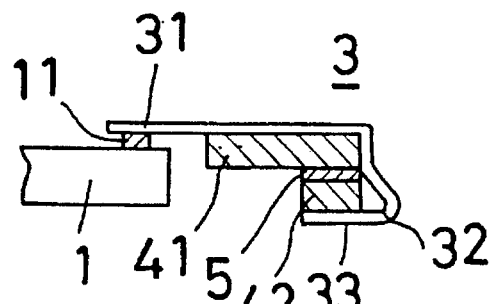
Figure 4:
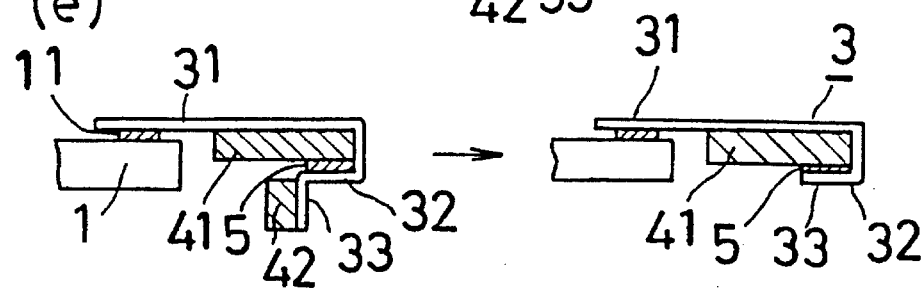

FIG. 4, (a) shows a surface mount component which is another embodiment having a semifinished product having four frames 42 along its outer periphery as shown in FIG. 28. As seen in FIG. 4, (a), each frame 42 is folded over through 180 degrees at the outer lead portions 32 of leads 3 and bonded to the rear side of the base 41 by an adhesive layer 5. In this case, the outer lead portion 32 needs to have a length sufficient for folding.

With this surface mount component, the base 41 is joined to an IC chip 1 by sealing resin 2, so that the frames 42 are made integral with the IC chip 1 by being bonded to the base 41. This ensures that the outer lead portions 32 of the leads retain their shape accurately.

Further with this surface mount component, the elasticity of the outer lead portion 32 bent to a circular-arc form produces an effect to press this portion into contact with the precoat solder layer as is the case with FIG. 17.

FIG. 4, (b), (c) and (d) show different modifications of the above surface mount component. The outer lead portion 32 can be modified variously in shape.

With the surface mount component shown in FIG. 4, (e), the outer lead portion 32 itself of each lead 3 is secured to the rear surface of the base 41 with an adhesive layer 5 first, and the frame 42 at the lead outer end is thereafter cut off.

Figure 5:
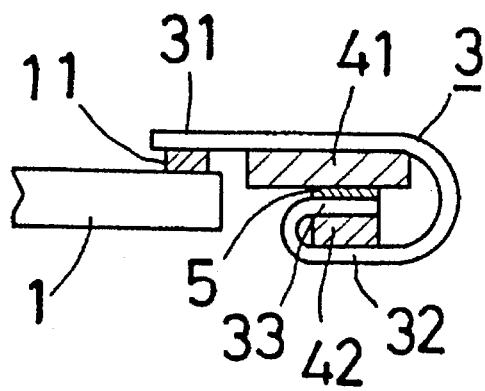
Figure 5:
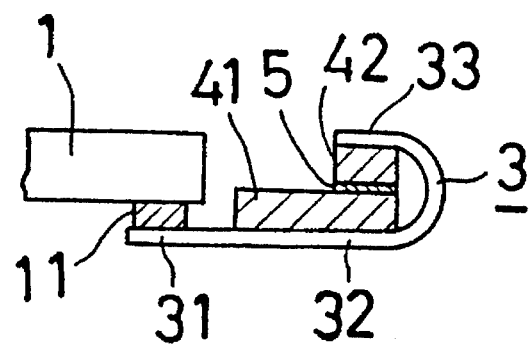
Figure 5:
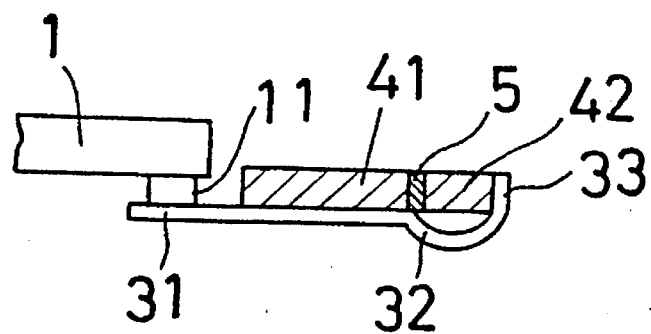
Figure 5:
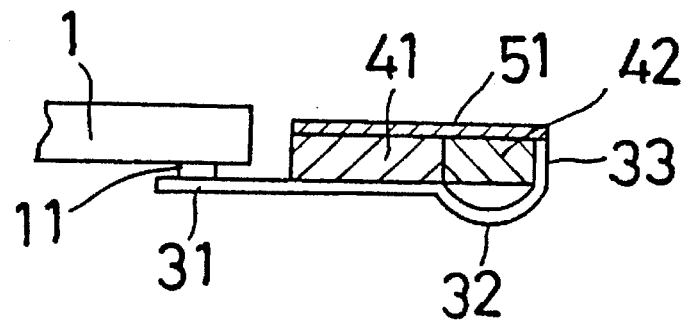

With the surface mount component shown in FIG. 5, (a), each frame 42 is folded over through 360 degrees at the outer lead portions 32 of leads 3, and the outer ends 33 of the leads are secured to the rear surface of the base 41.

With the surface mount component shown in FIG. 5, (b), each frame 42 is upwardly folded over through 180 degrees at the outer lead portions 32 of leads 3 and fixedly adhered to the front surface of the base 41.

With the surface mount component shown in FIG. 5, (c), the base 41 and the frame 42 are arranged on the same plane and joined together with an adhesive layer 5. FIG. 5, (d) shows that the base and the frame are joined together with an adhesive tape.

Figure 31:
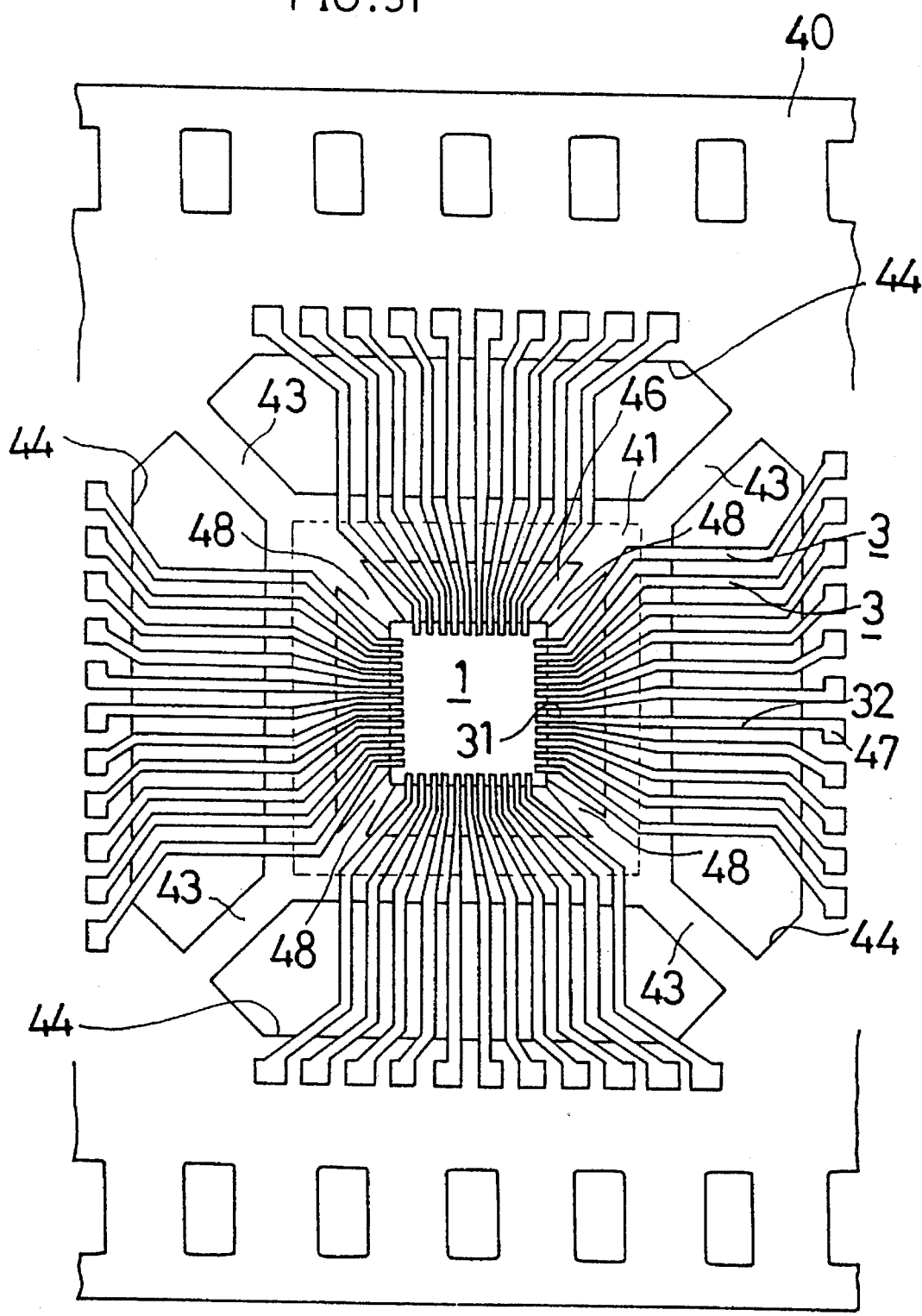
FIG. 31 is a plan view showing a semifinished product of another embodiment of surface mount component of the invention.

In the case of the foregoing embodiments, the base 41 of the support film 4 is made integral with the IC chip 1 by the sealing resin 2, whereas the base can be connected to the IC chip 1 by four arms 48 extending from the respective four corners of the base 41 toward the inner windows 46 as shown in FIG. 31 instead of the sealing resin 2.

Figure 32:
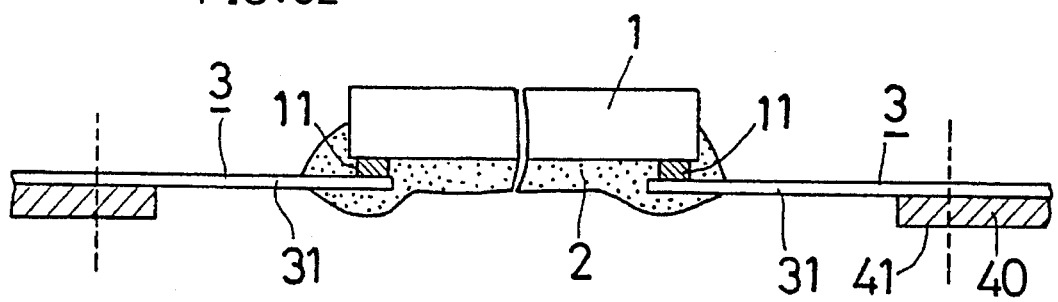
FIG. 32 is a sectional view of the semifinished product.

In this case, the sealing resin 2 is applied to cover the bumps 11 and the ends of the arms 48 without covering the base 41 of the carrier tape 40 as shown in FIG. 32. Consequently, the base 41 is connected to the IC chip 1 by the arms 48.

After the above resin sealing step, the carrier tape 40 is cut along the broken lines shown in FIGS. 31 and 32, and the inner lead portions 31 are then subjected to the required forming.

Figure 6:
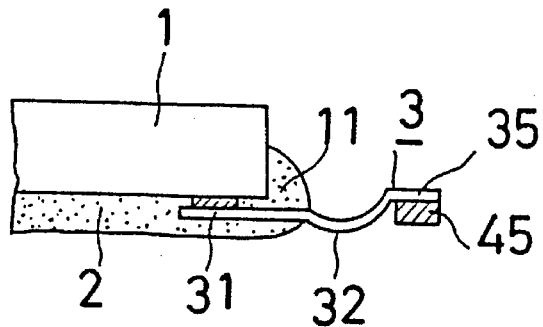
Figure 6:
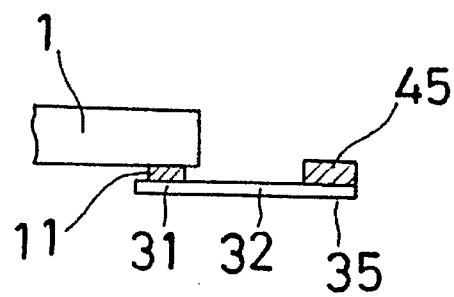
Figure 6:
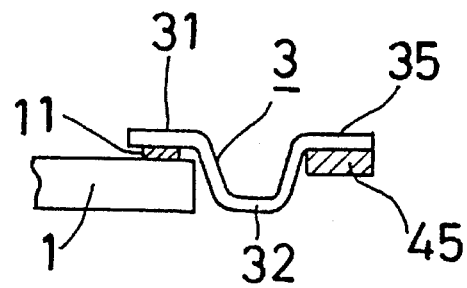
Figure 6:
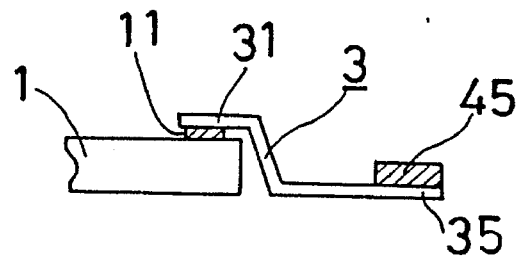

Consequently as shown in FIG. 6, (a), outer lead portions 32 are formed newly in the area where the inner lead portions 31 of the leads 3 were initially formed, and a new frame 45 is formed in the area where the base 41 of the support film 4 was initially present. The outer ends 35 of the leads 3 are interconnected by the new frame 45.

FIG. 6, (b) shows a modification of the above surface mount component. The shape of the outer lead portion 32 is optional.

Figure 33:
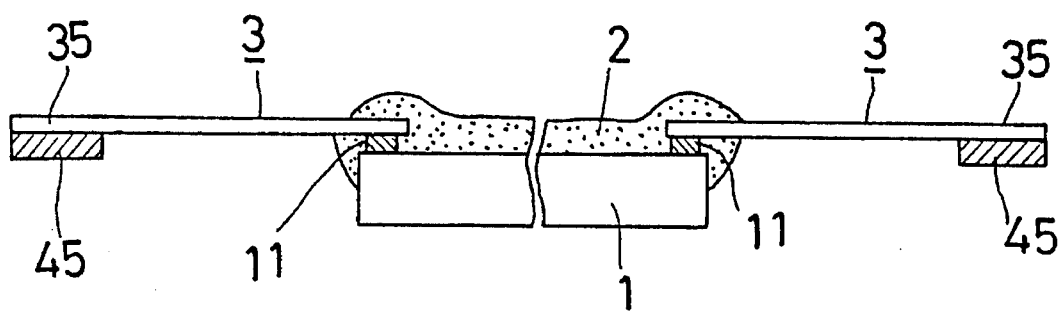
FIG. 33 is a sectional view of a semifinished product of another embodiment.

Further as shown in FIG. 33, the IC chip 1 in the arrangement of FIG. 32 can be inverted. In this case, each lead 3 is formed to a circular-arc shape as seen in FIG. 6, (c) to provide an outer lead portion 32.

FIG. 6, (d) shows a modification of the surface mount component of FIG. 6, (c).

Figure 7:
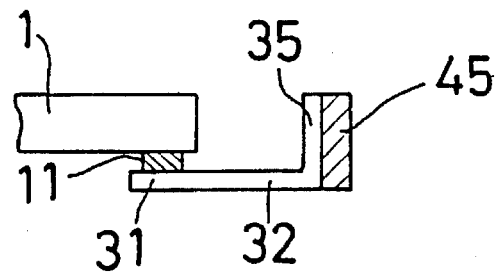
Figure 7:
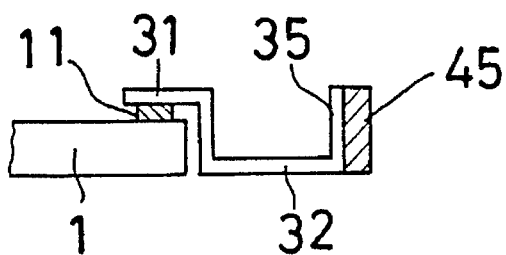

FIG. 7, (a) and (b) show surface mount components wherein four divided frames 45 are positioned upright vertically as interconnected.

Figure 8:
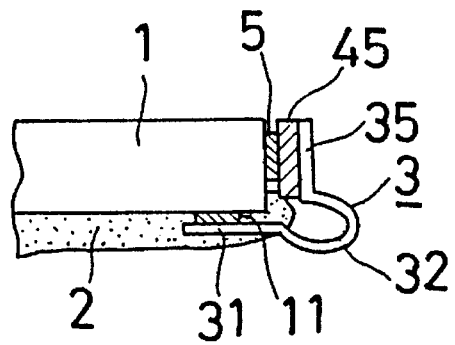
Figure 8:
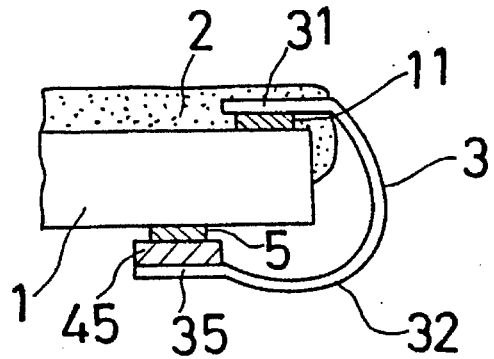

With the foregoing embodiments, the outer end 33 of each lead 3 is connected by some connecting member to the IC chip 1, while the outer end 35 of each lead 3 can be secured to the outer surface of the IC chip 1 with an adhesive layer 5 as shown in FIG. 8, (a) and (b), whereby the lead 3 is given an enhanced structural strength.

FIG. 8, (a) and (b) show surface mount components wherein the frame 45 at the outer end 35 of the lead 3 is fixedly adhered to an outer surface of the IC chip 1, and the lead 3 is also secured to a side face of the chip 1 with an adhesive layer 52.

Figure 9:
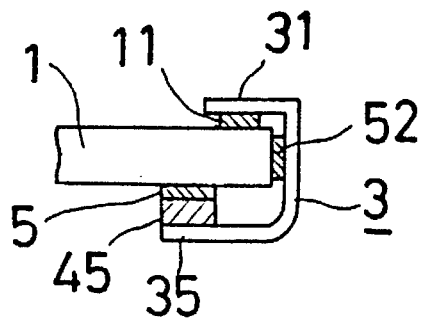
Figure 9:
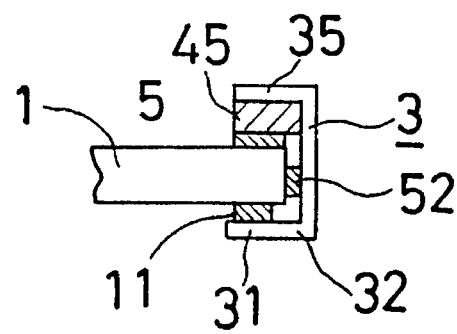
Figure 9:
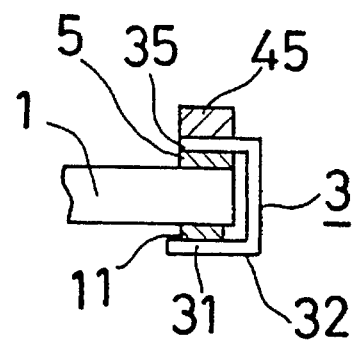
Figure 9:
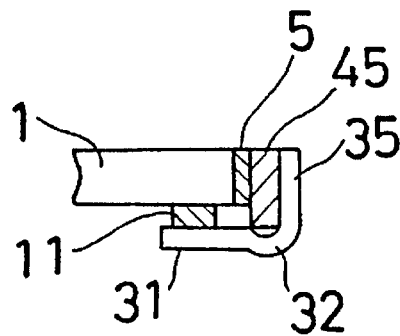

FIG. 9, (c) shows an embodiment wherein the lead outer end 35 of the lead 3 is fixedly adhered directly to a surface of the IC chip 1.

FIG. 9, (d) shows an embodiment wherein the frame 45 is fixedly adhered to a side face of the IC chip 1, and the lead 3 has an outer lead portion 32 which is formed to a circular-arc shape.

In the case of the foregoing embodiments, the lead outer ends 35 are made integral with the IC chip 1, with the lead pitch held definite by the frame 45 during production, while with use of production equipment adapted to join all lead outer ends 35 to an outer surface of the IC chip 1 with the end pitch held definite, the frame 45 for holding the lead ends 35 can be dispensed with.

Figure 10:
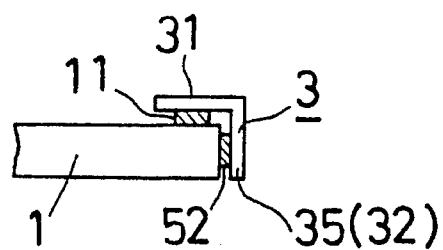
Figure 10:
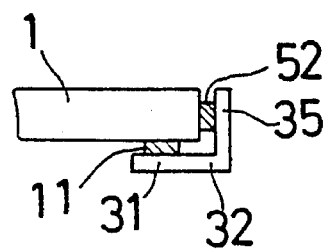
Figure 10:
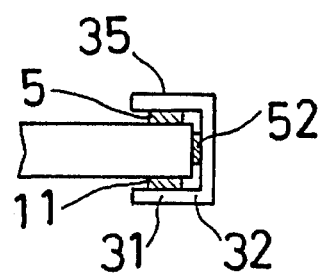
Figure 10:
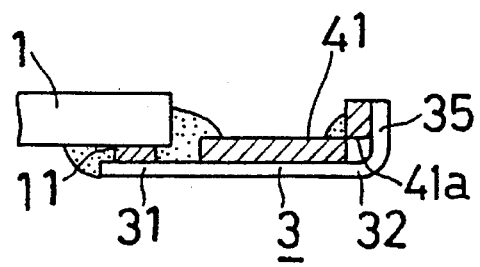
Figure 10:
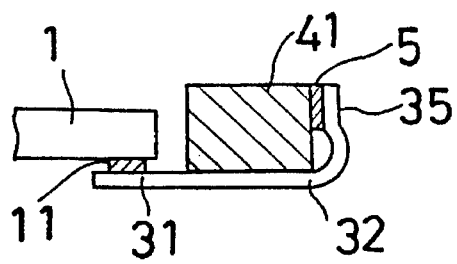

FIG. 10, (a), (b) and (c) show surface mount components thus fabricated.

FIG. 10, (d) shows an embodiment wherein a slit 41a is formed in the base 41 to vertically bend the base 41. As shown in FIG. 10, (e), the outer end 35 of the lead 3 can be secured to a side face of the base 41.

Figure 34:
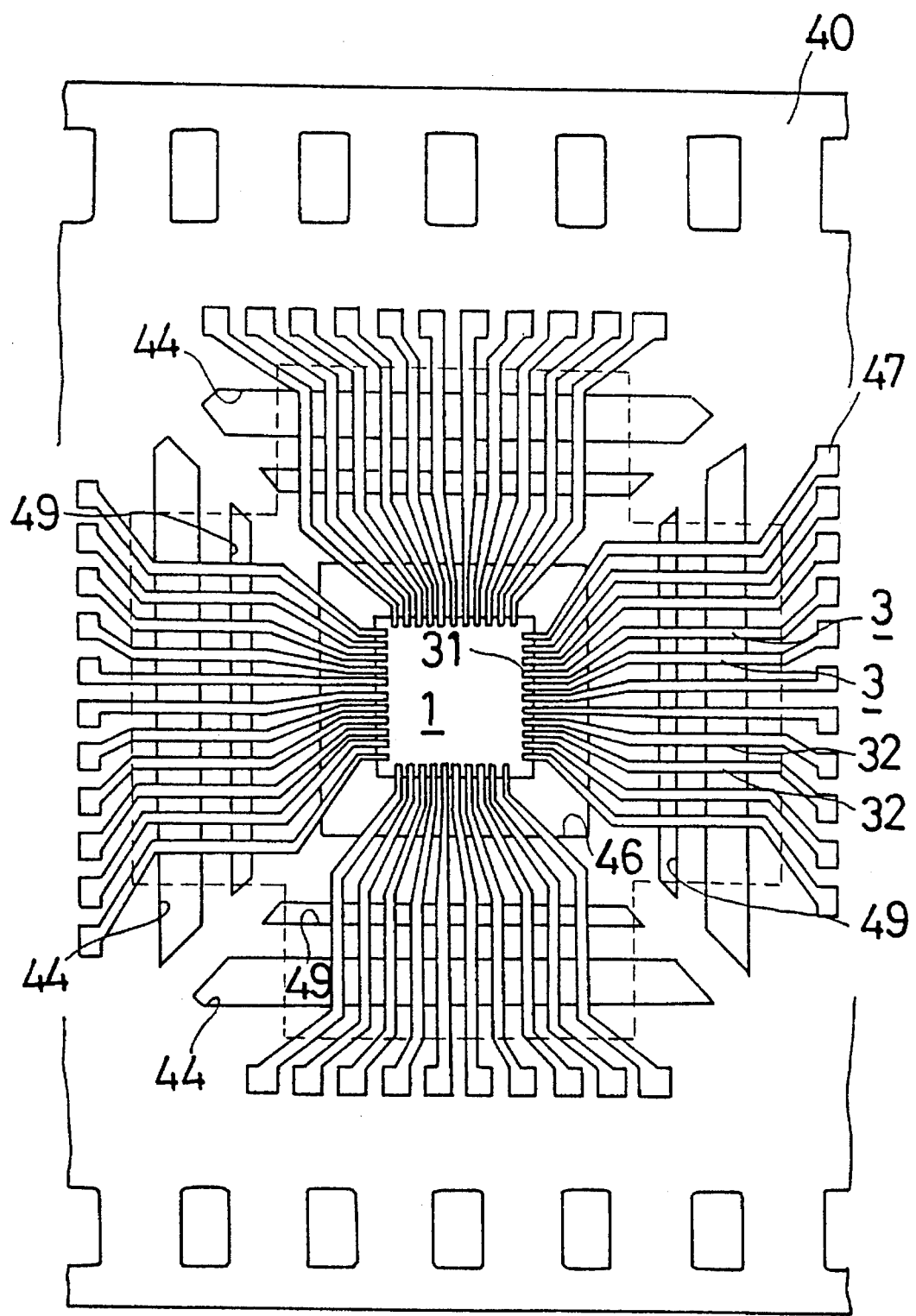
FIG. 34 is a plan view showing a semifinished product of another embodiment of surface mount component of the invention.
Figure 35:
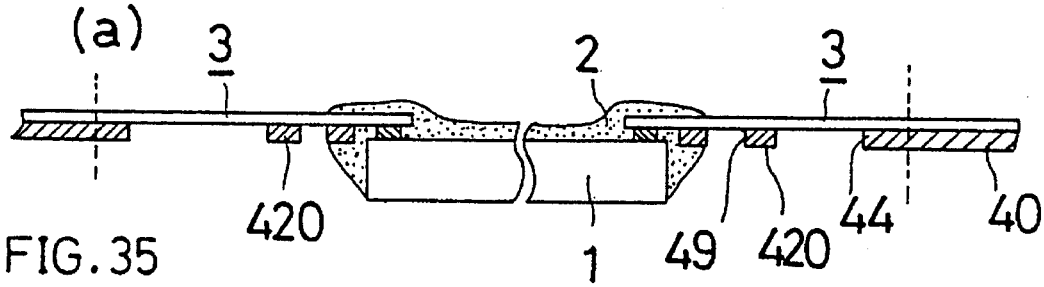
FIG. 35, (a), (b) and (c) are diagrams showing stepwise a production process wherein the semifinished product is used.
Figure 35:
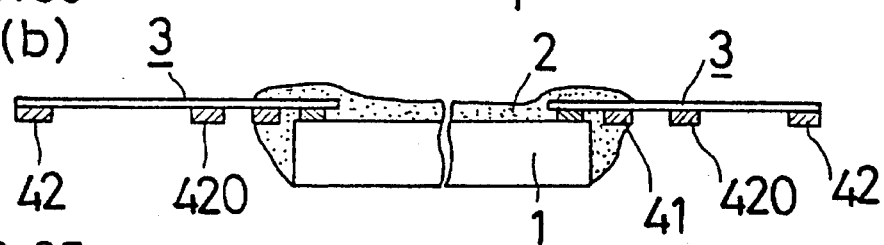
Figure 35:
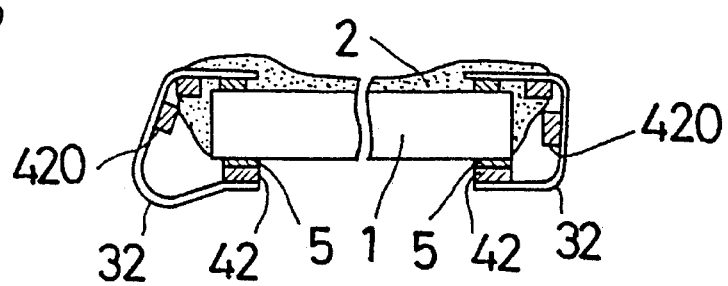

FIG. 34 and FIG. 35, (a), (b) and (c) show a process for producing another surface mount component. As seen in FIGS. 34 and 35, (a), a middle window 49 is formed in a carrier tape 40 between an inner window 46 and each outer window 44. The carrier tape 40 is cut along the broken lines shown to cause two frames 42, 420 to interconnect a plurality of leads 3 as grouped to extend in the same direction as seen in FIG. 35, (b).

Each of the leads 3 is bent to a desired shape as shown in the right-hand side or left-hand side of FIG. 35, (c). The frame 42 at the lead outer end is fixedly adhered to the rear surface of an IC chip 1, and the inner frame 420 is caused to bear on a side face of the IC chip 1 or is fixedly adhered thereto when required.

With this surface mount component, the lead 3 which is long is folded over to a circular-arc form through an angle of at least 180 degrees as shown in FIG. 35, (c). Even in this construction, the lead 3 is held in a stabilized posture by the contact of the inner frame 420 with the chipe side face.

Figure 36:
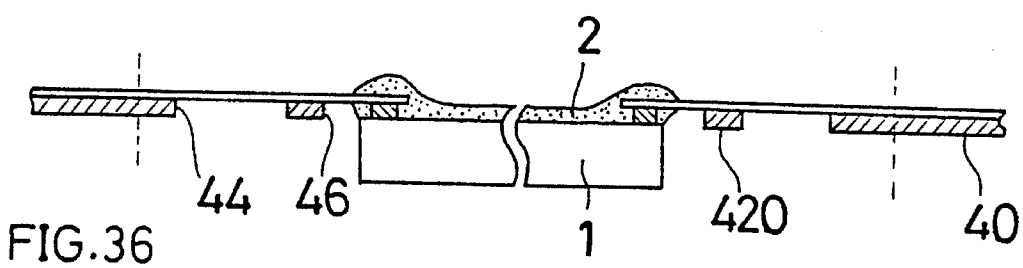
FIG. 36, (a), (b) and (c) are diagrams showing stepwise a production process of another embodiment.
Figure 36:
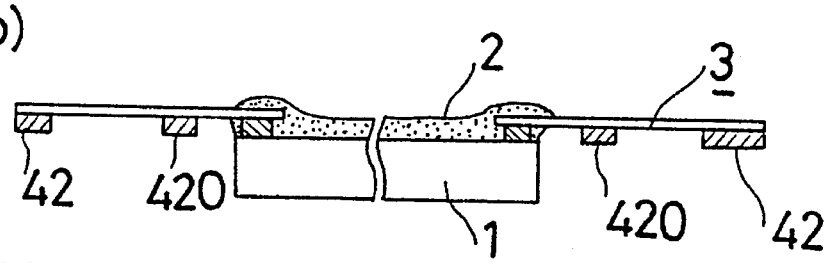
Figure 36:
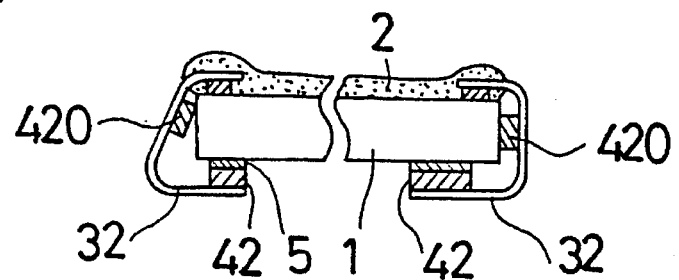

FIG. 36, (a), (b) and (c) show an embodiment wherein the two frames 42, 420 shown in FIG. 35 are used for the embodiment of FIGS. 31 to 33. The drawings show a production process in corresponding relation to FIG. 35, (a), (b) and (c).

Figure 37:
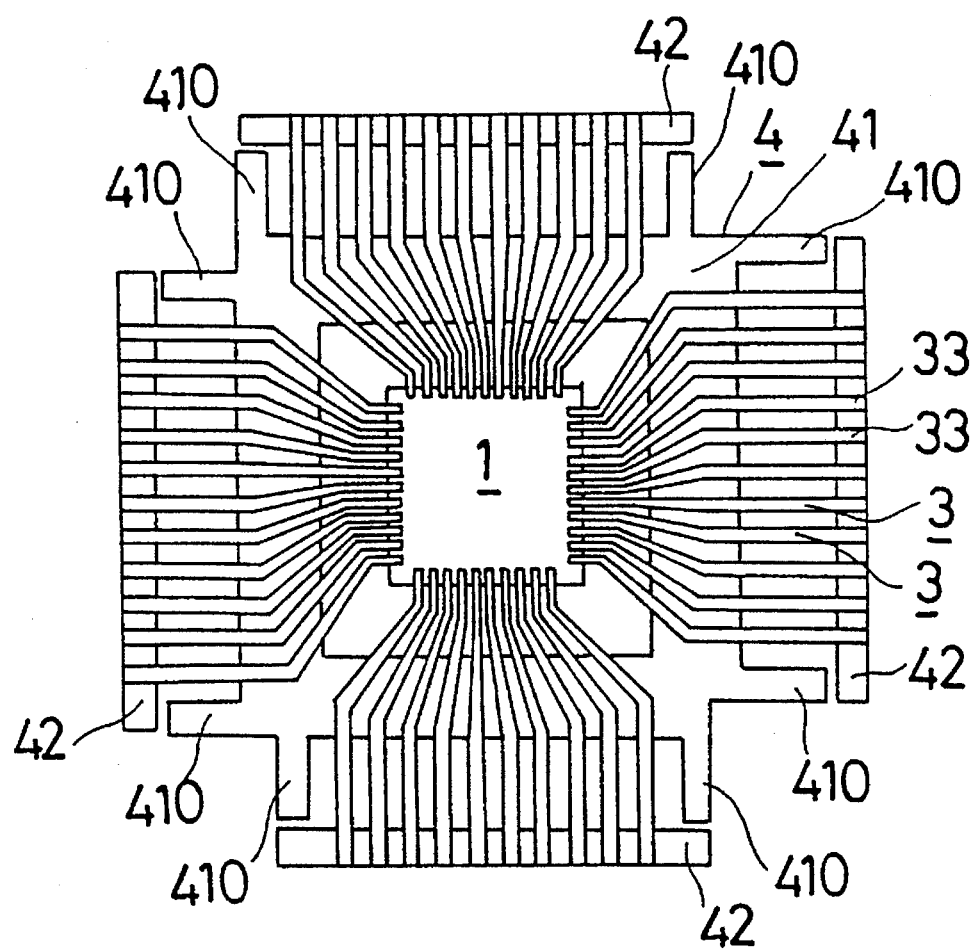
FIG. 37 is a plan view of a semifinished product of another embodiment of surface mount component according to the invention.
Figure 38:
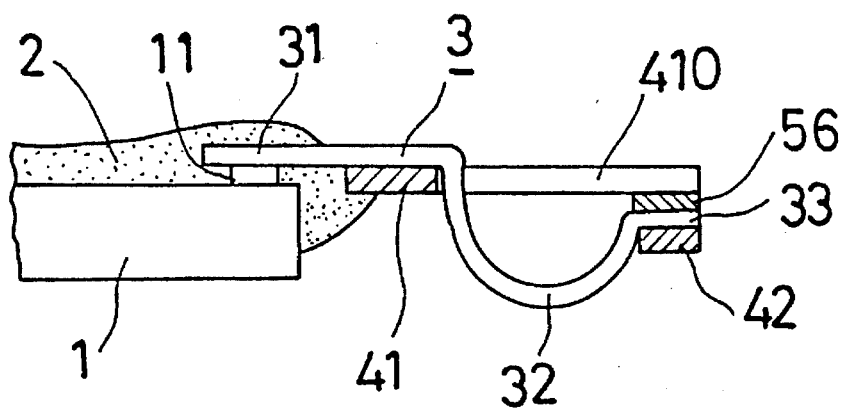
FIG. 38 is a fragmentary front view partly broken away and showing the embodiment as completed.

FIGS. 37 and 38 show an embodiment in which the outer lead portion 32 of each lead 3 is formed by an improved method.

With reference to FIG. 37, a support film 4 is formed with four frames 42 each adapted to interconnect a plurality of leads 3 extending from an IC chip 1 in the same direction, and is further formed with support arms 410, 410 extending from a base 41 toward opposite ends of each frame 42.

After the IC chip 1 as placed on the support film 4 is sealed with resin, the leads 3 are formed to a circular-arc shape as seen in FIG. 38. The leads 3 are free to deform and therefore bend to the circular-arc form without stretching at this time.

Since the frame 42 is consequently moved toward the base 41, the opposite ends of the frame 42 are pressed on from above by the respective support arms 410, and the outer ends of the arms 410 are fixed to the lead outer ends 33 with an adhesive layer 56.

As a result, each frame 42 is connected to the base 41 and holds the lead ends 33.

With the surface mount component, the leads 3 can be formed to the circular-arc shape without stretching. The method is therefore useful when the leads are made of a material which is low in ductility or when the leads are bent to a great extent.

The level of the frame 42 is adjustable by varying the thickness of an adhesive tape providing the adhesive layer 56.

The forming method illustrated in FIGS. 37 and 38 is usable also for surface mount components of the construction shown in FIGS. 31 to 33.

Figure 39:
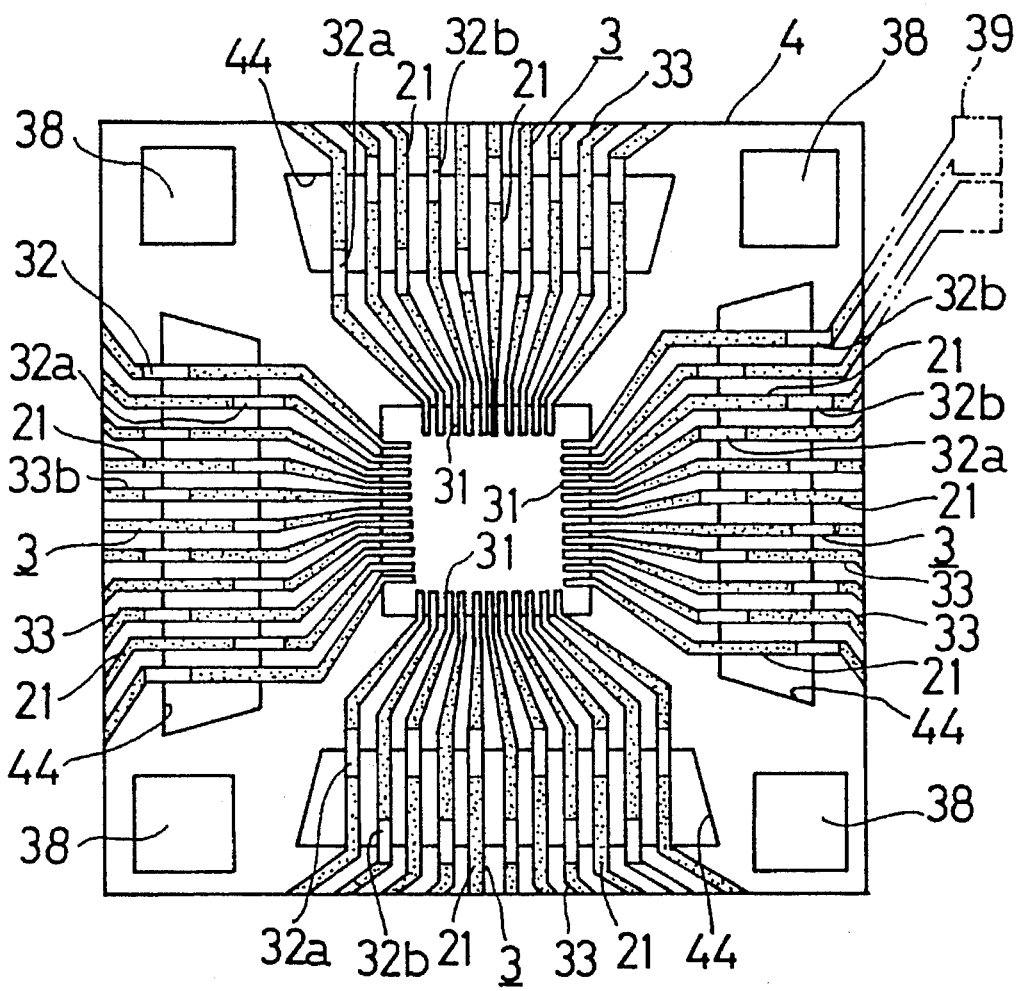
FIG. 39 is a rear view showing a semifinished product of an embodiment wherein a glass substrate is used as a support film.

FIG. 39 shows a semifinished product of surface mount component which has leads 3 formed on the rear surface of a support film 4 comprising, for example, a thin glass substrate having a thickness of about 100 to about 300 micrometers. The support film 4 is formed in its outer peripheral portion with four outer windows 44. The leads 3 extend over the outer window 44.

Each of the leads 3 is formed at a region thereof partly exposed from the outer window 44 with an outer lead portion 32a or 32b serving as a solder bonding portion, and is coated with a solder resist 21 except for the outer lead portion 32a or 32b. The two outer lead portions 32a and 32b adjacent to each other are spaced apart from each other longitudinally of the leads.

A rectangular bonding pad 38 having an area sufficiently larger than the solder bonding area of all leads 3 is formed at each of four corners of the support film 4 on the rear surface thereof. The bonding pad 38 can be formed simultaneously when a copper foil is etched to form the pattern of leads.

Figure 40:
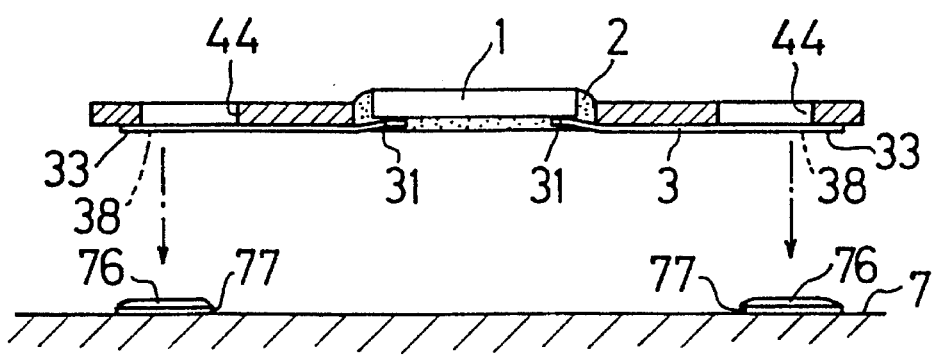
FIG. 40 is a sectional view of the embodiment as completed.

An IC chip 1 is mounted on the semifinished product and sealed with resin 2 as shown in FIG. 40, whereby a surface mount component is completed.

When the glass substrate forming the support film is provided with test pads 39 connected to the leads and shown in broken lines in FIG. 39, the test pads 39 are usable for testing the IC chip 1 as mounted in place for operation.

When the component is to be surface-mounted on a wiring board 7, the board 7 has formed thereon pads and a solder layer (not shown) for soldering the outer lead portions 32a, 32b, and pads 77 in the same form as the bonding pads 38 at the positions to be opposed to the pads 38, with a solder paste layer 76 formed over the pads 77. The outer lead portions 32a, 32b and the bonding pads 38 are collectively treated by a reflow process at the same time.

Consequently, the support film 4 is fixed to the wiring board 7, and the leads 3 are soldered to the board 7 for electrical connection.

The solder paste layer 76 opposed to the bonding pad 38 is shaped to be sufficiently larger than the width of the lead 3, so that while the volume of the layer is reduced by the reflow treatment, the surface mount component is drawn toward the wiring board. If the component is not positioned in place, the layer also acts to draw the component in a direction to correct the displacement, i.e., in a direction to register the bonding pads 38 with the respective pads 77 on the wiring board.

Accordingly, the leads are soldered reliably as positioned accurately on the respective corresponding portions of the solder layer without displacement. The solder joints can be visually checked with a camera through the outer windows 44.

The surface mount component described especially has sufficient strength against external forces and heat since the support film 4 comprises a glass substrate. The support film 4 remains planar and prevents rise of the leads off the wiring board also while the solder paste layer 76 formed as opposed to the bonding pads 38 shrinks and solidifies.

Moreover, the glass substrate formed with the lead pattern is merely cut during the production process without lead forming or other working steps to complete the surface mount component. The component is therefore well-suited to mass production.

Figure 41:
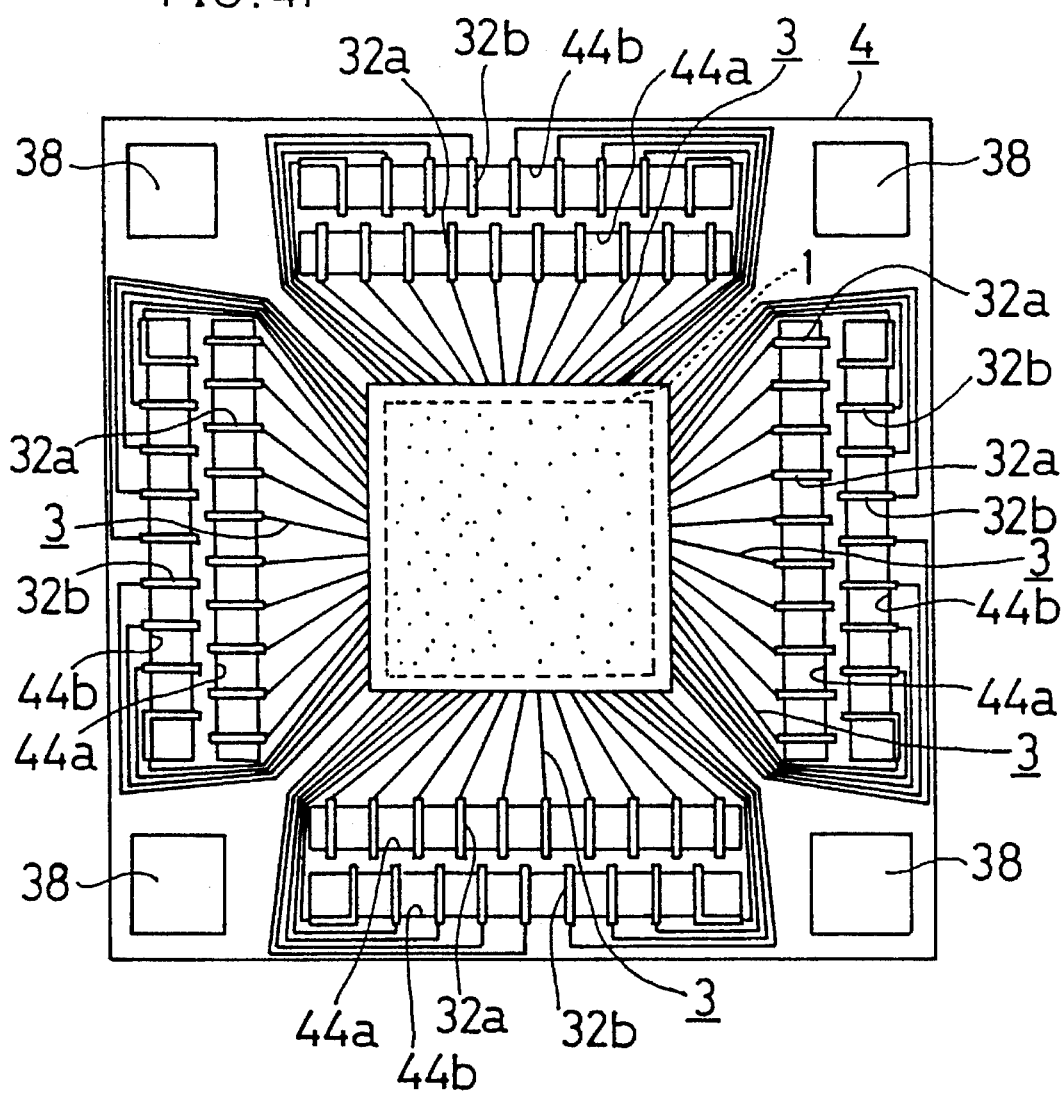
FIG. 41 is a rear view showing another embodiment wherein a glass substrate is used as a support film.
Figure 42:
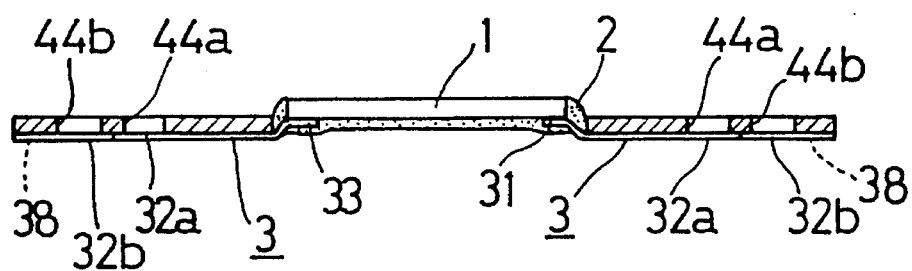
FIG. 42 is a sectional view showing the embodiment.

FIGS. 41 and 42 show another embodiment of surface mount component.

The illustrated support film 4 is formed with two outer windows 44a, 44b along each of four sides thereof. A plurality of leads 3 extending from an IC chip are so patterned that they are divided into a first group of leads extending over the inside outer window 44a from inside thereof through the shortest path, and a second group of leads extending over the outside outer window 44b from outside thereof through a bent path. As a result, outer lead portions 32a, 32b are alternately provided over the outer windows 44a, 44b. The adjacent outer lead portions 32a, 32b are away from each other longitudinally of the leads.

Bonding pads 38 like those already described are formed at the respective four corners of the support film 4.

From the IC chip to the outer lead portion 32a or 32b, each lead has a small width in accordance with the total number of leads. The width of the lead is represented by a line in FIG. 41.

The structure wherein the support film 4 is formed with the bonding pads 38 so as to be secured to the wiring board by soldering can be used also for the surface mount components shown in FIG. 3, (a), FIG. 6, (b) and (d), FIG. 10, (d), FIGS. 21 to 30, etc.

Figure 43:
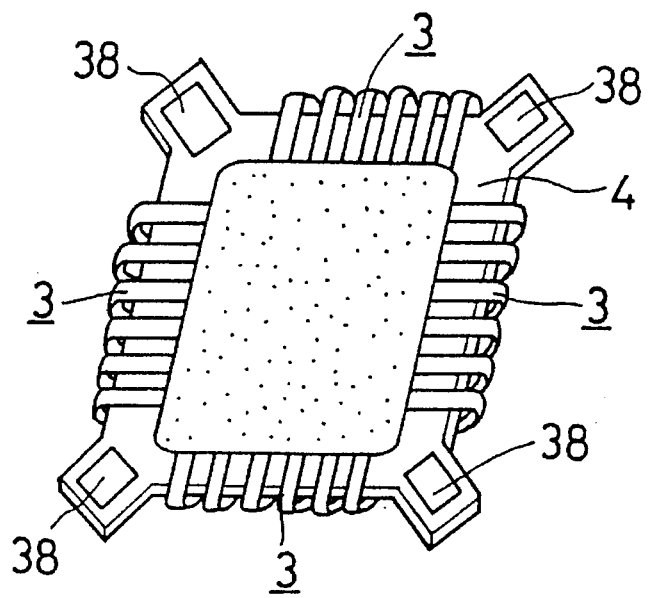
FIG. 43 is a perspective view showing the rear side of a surface mount component having bonding pads on a support film.
Figure 44:
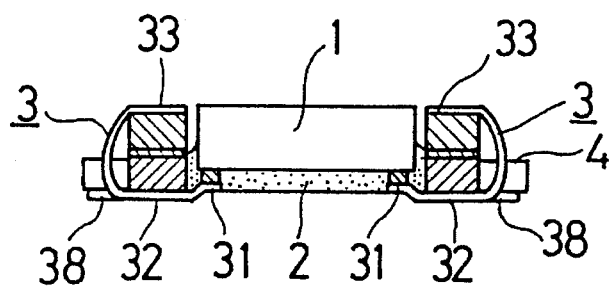
FIG. 44 is a sectional view of the surface mount component.

For example, FIGS. 43 and 44 show a surface mount component having the same construction as the one shown in FIG. 5, (b). Bonding pads 38 are formed on portions projecting from the four corner of a support film 4.

Figure 45:
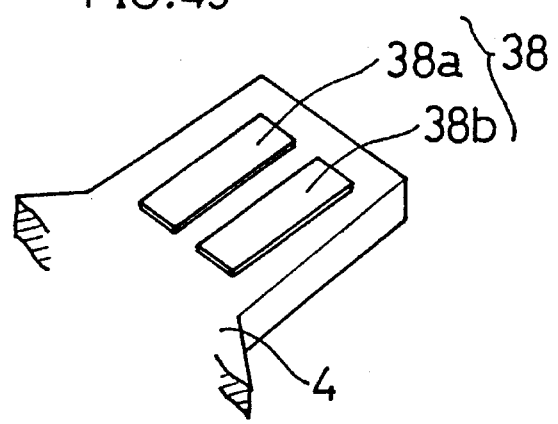
FIG. 45 is an enlarged perspective view of another example of bonding pad.

Each of the bonding pads 38 can be composed of pad pieces 38a, 38b as shown in FIG. 45.

The surface mount components described above and embodying the invention are produced by the process for producing conventional TCPs with improvements incorporated therein, whereas surface mount components constructed according to the invention can of course be fabricated by various processes.

Figure 46:
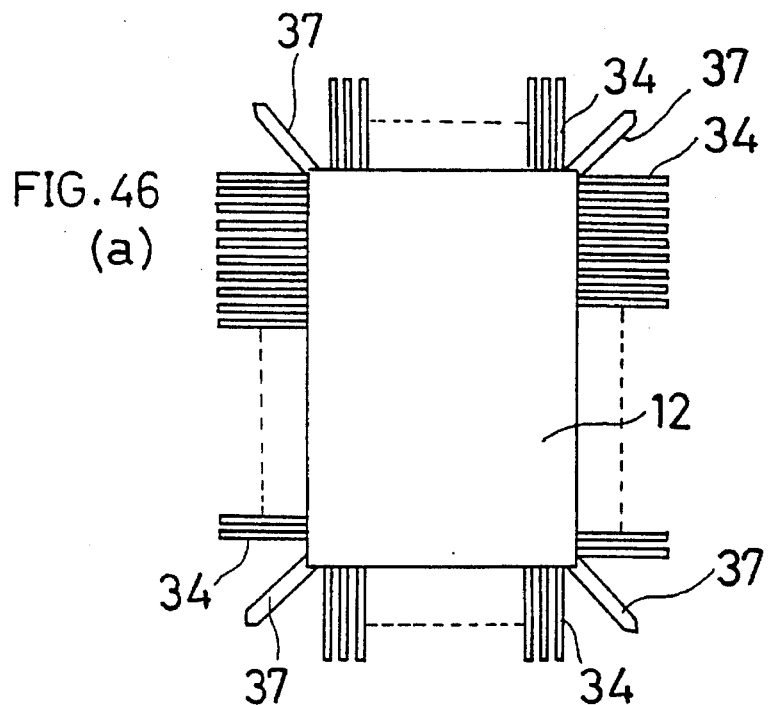
FIG. 46, (a), (b) and (c) are diagrams showing stepwise a process for producing another embodiment of surface mount component of the invention.
Figure 46:
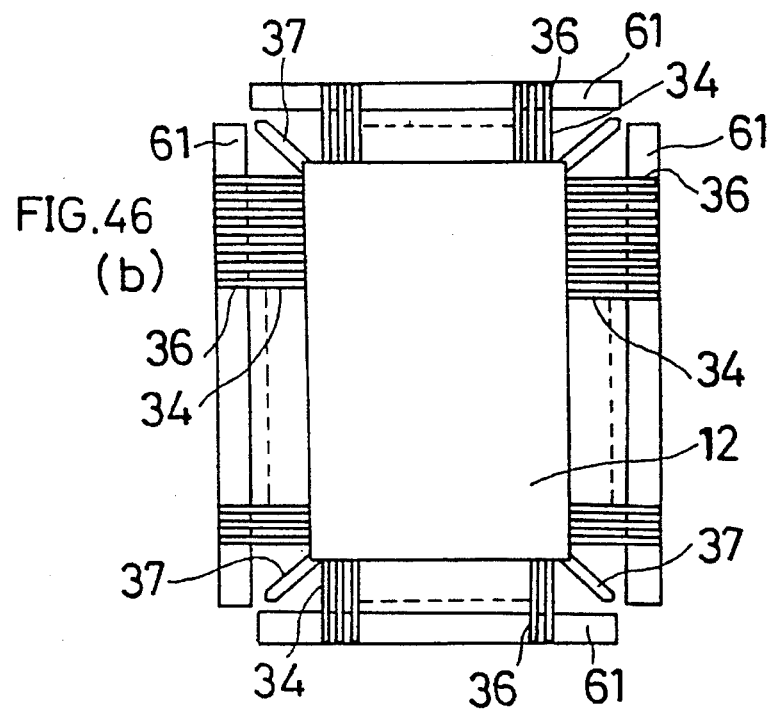
Figure 46:
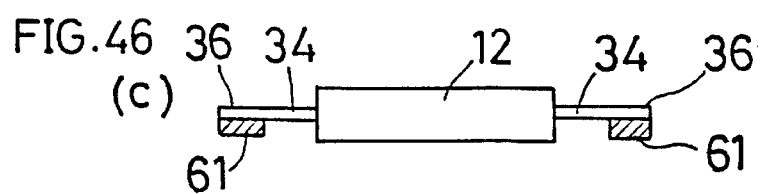

FIG. 46, (a), (b) and (c) show an IC package such as a conventional QFP to which the present invention is applied.

As shown in FIG. 46, (a), the IC package 12 is prepared using a known lead frame, the package 12 having four die pad supports 37 which are conventionally removed by cutting off, and a plurality of leads 34 projecting in four directions. The leads 34 extending in the same direction as a group are then interconnected by an insulating striplike plate 61 as shown in FIG. 46, (b) and (c).

Each lead 34 is formed in the same manner as in the prior art, and the four plates 61 are thereafter interconnected and connected to the supports 37.

Figure 11:
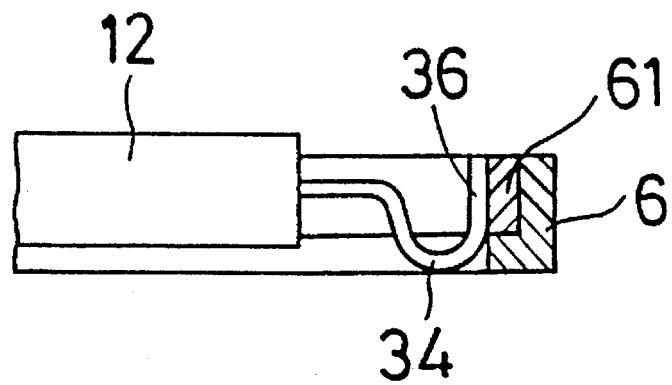
Figure 11:
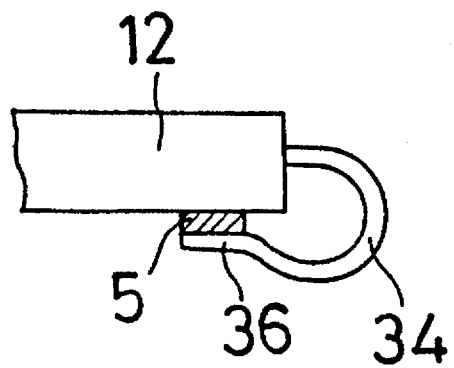

FIG. 11, (a) shows the leads 34 formed to a circular-arc shape, with the lead outer ends secured to a frame member 6.

FIG. 11, (b) shows the leads 34 bent through 180 degrees, with the lead outer ends secured to the rear side of an IC package 12 by an adhesive layer 5.

Furthermore, the structures shown in FIGS. 6 to 9 can be used for the IC package 12 wherein the lead frame is used.

Use of any of the foregoing embodiments for providing surface mount components makes it possible to reduce the lead pitch, and the component and other surface mount components can be mounted on the wiring board collectively by the reflow process.

When the surface mount component has a construction wherein the IC chip body is provided with a plurality of electrical connector leads utilizing a carrier tape having a test pattern as already described, the chip body can be checked by various tests at the tester points by the semiconductor manufacturer having clean room equipment so as to finish the acceptable products only as the components of the invention. The products can then be made available for mounting with the same warranty as other IC packages. This assures the user of reliable surface mounting.

Further according to the invention, the joint between the component and the wiring board can be visually checked by a camera. This eliminates the need for a clean room or like equipment and the maintenance of the equipment.

Accordingly, the problem encountered with the conventional COG technique can be overcome to realize a collective reflow treatment.

Although the COG technique for VLSIs involves the problem of heat generation, a sufficient effect to dissipate heat can be achieved with the surface mount component of the invention wherein the leads are formed to a circular-arc shape.

The present invention is applicable also to so-called multi-chip modules and hybrid ICs wherein IC chips or surface mount components are incorporated in a chip body.

Figure 47A:
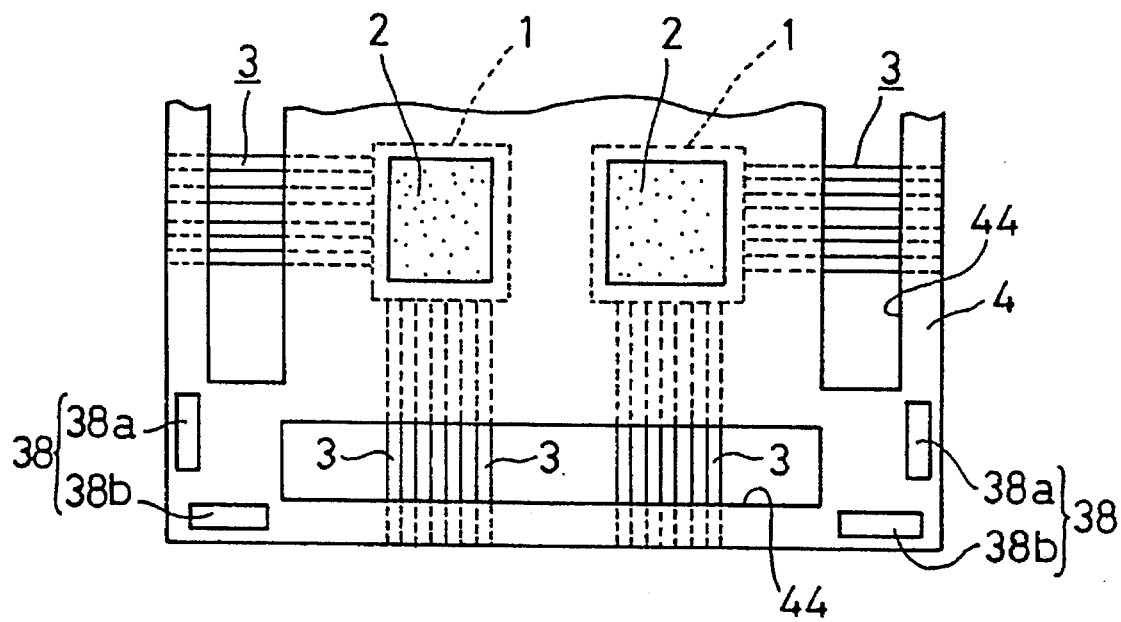
FIG. 47, (a) and (b) are a rear view and a sectional view, respectively, of a multi-chip module embodying the invention.
Figure 47B:
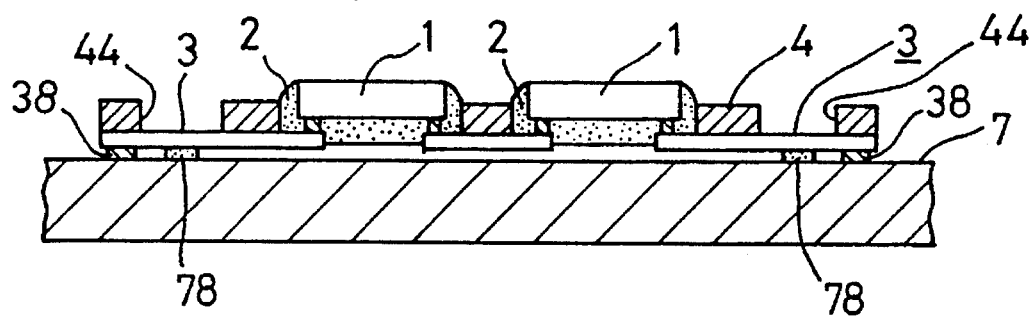

FIG. 47, (a) and (b) show an example of multi-chip module. A plurality of IC chips 1 are mounted on a support film 4, and leads 3 extending from the IC chips 1 are connected to a wiring board 7 by a solder layer 78, at outer lead portions exposed from outer windows 44. A pair of bonding pads 38a, 38b of copper foil are arranged perpendicular to each other at each corner of the support film 4 on the rear side thereof. The pads 38a, 38b are soldered to pads on the wiring board 7. It is likely that the multi-chip module will be placed on the wiring board as displaced when to be surface-mounted. Even in this case, the shrinkage of the solder produces a displacement correcting force in two directions along the lengths of the pads 38a, 38b, with the result that the module can be soldered as positioned accurately in place.

Figure 48:
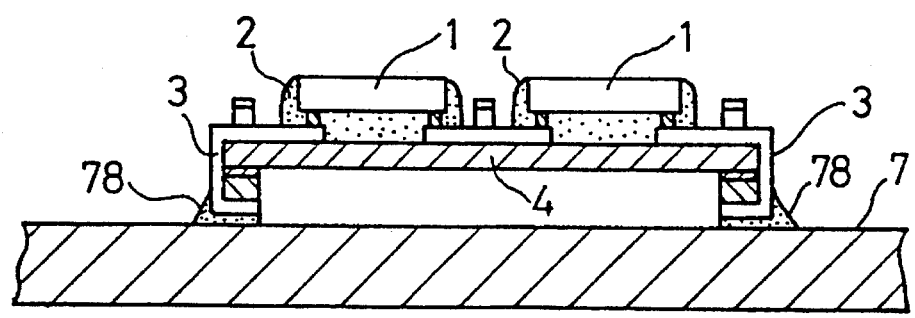
FIG. 48 is a sectional view of another multi-chip module.
Figure 49:
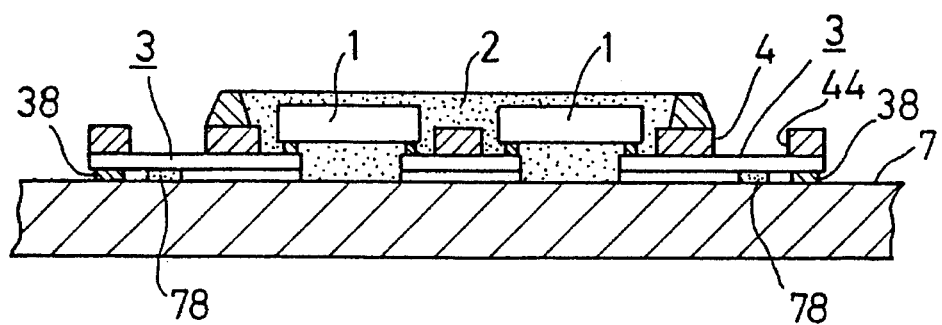
FIG. 49 is a sectional view showing a hybrid IC embodying the invention.
Figure 50:
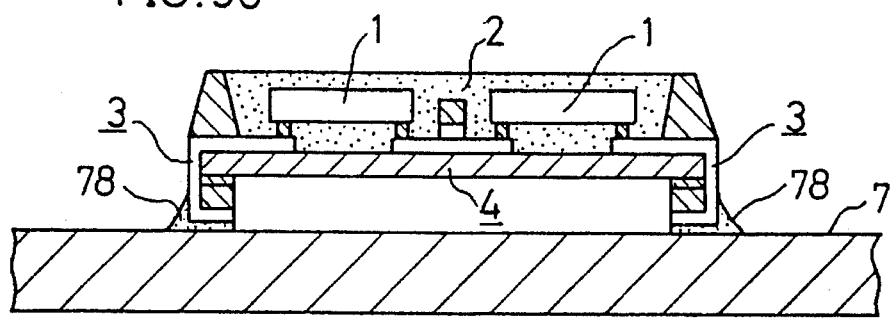
FIG. 50 is a sectional view showing another hybrid IC.

FIG. 48 shows another example of multi-chip module, FIG. 49 an example of hybrid IC, and FIG. 50 another example of hybrid IC.

Figure 51:
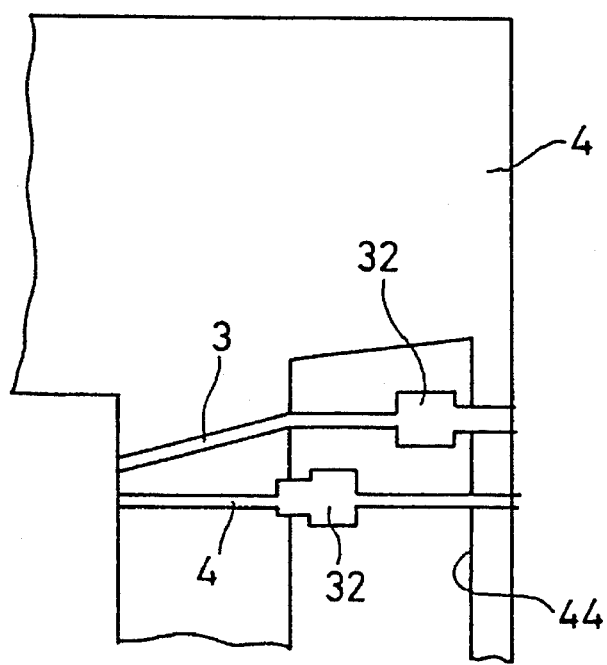
FIG. 51 is a plan view showing leads of modified configuration.

With reference to FIG. 51, outer lead portions 32, 32 exposed from an outer window 44 of a support film 4 and adjacent to each other each have an increased width as displaced from the other. This assures a sufficient amount of solder even if the lead pitch is reduced.

Figure 52:
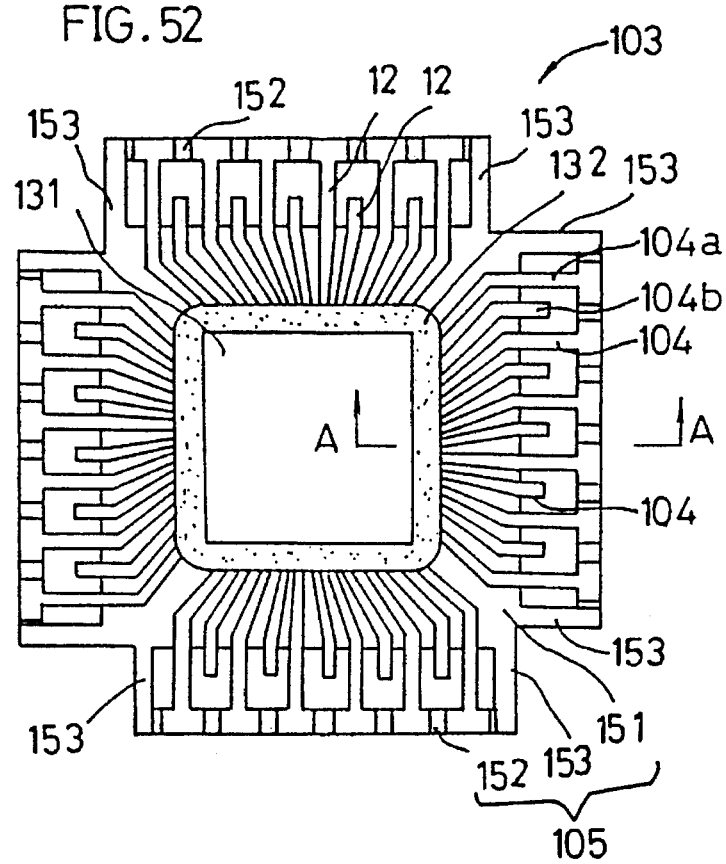
FIG. 52 is a plan view of another surface mount component, i.e., a TCP, embodying the invention.
Figure 53:
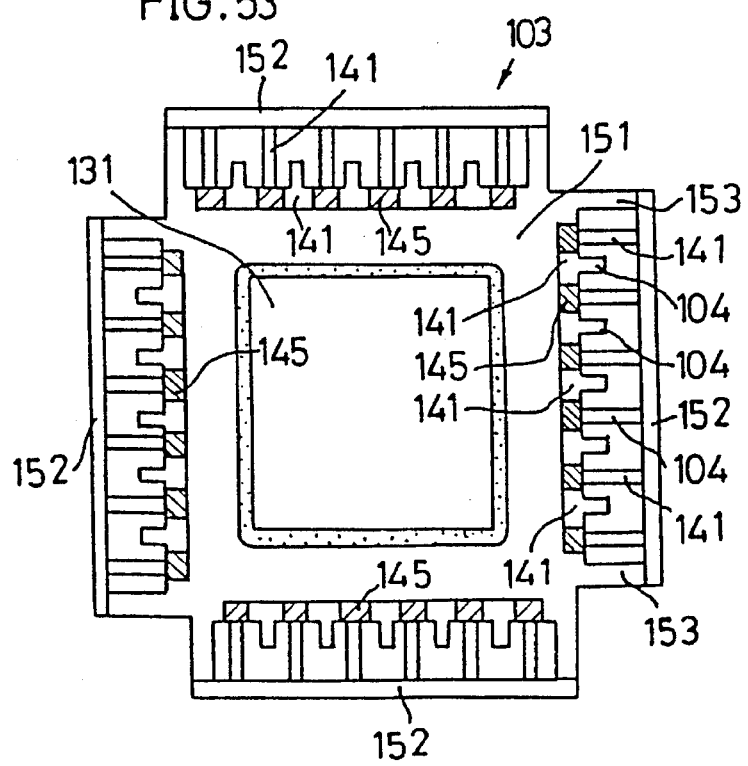
FIG. 53 is a rear view of the TCP.
Figure 54:
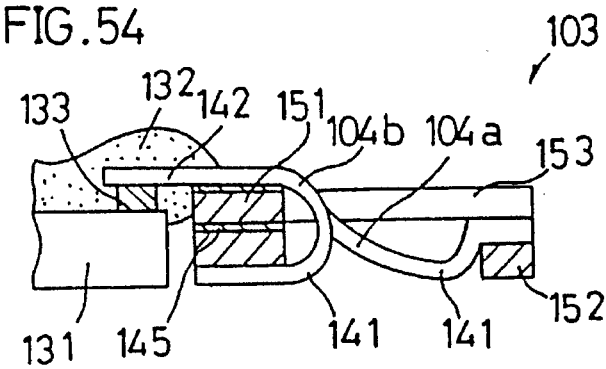
FIG. 54 is a fragmentary sectional view of the TCP.

FIGS. 52 to 54 show a TCP 103 wherein a plurality of copper foil leads 104 extending from the periphery of an IC chip 131 toward four directions are affixed to a support film 105 comprising a polyimide substrate, glass-epoxy substrate or the like. Each lead 104 has an inner lead portion 142 joined to a bump 133 on the IC chip 131, and the connected portion is sealed with resin 132.

The support film 105 comprises a base 151 having the chip 131 mounted thereon, arms 153 projecting from the respective ends of each side of the base 151, and a striplike frame 152 interconnecting the outer ends of the pair of arms 153, 153 extending in the same direction.

While the support film 105 is prepared from a sheet of film carrier tape, the frame 152 is cut off from the base 151 and the arms 153 once, then shifted toward the base 151 to lap over the outer ends of the arms 15 and fixedly adhered thereto.

Each of the leads 104 comprises a first lead 104a extending outward over the support film 105 and fixedly joined at its outer end to the frame 152, and a second lead 104b extending from the front surface of the base 151 to the rear surface thereof as bent through 180 degrees and fixedly joined at its outer end to the rear surface of the base 151 with an adhesive tape 145. The first leads 104a and the second leads 104b are arranged alternately.

In the region between the base 151 and the frame 152, the first lead 104a joined to the frame 152 of the support film 105 is bulged toward a wiring board in a circular-arc form as shown in FIG. 54. The circular-arc portion provides a joining portion 141 for the wiring board. The outer end of the second lead 104b joined to the rear surface of the base 151 of the support film 105 provides a joining portion 141 for the wiring board.

Accordingly, the joining portions 141 of the adjacent leads 104 are spaced apart from each other with respect to the direction of arrangement of the leads and also with respect to a direction orthogonal to this direction.

With the TCP 103 described above, the adjacent joining portions 141, 141 are sufficiently spaced apart from each other even if the lead pitch is reduced. This eliminates bridging with the solder. Moreover, the leads 104 have their outer ends integrally connected to the support film 105 and are therefore given a greater structural strength than in the convention TCP wherein the leads have a free outer end.

When the support film 105 is fixedly adhered to the wiring board for surface mounting, the leads are pressed against pads on the board and can be reliably mounted on the board surface.

Thus, the depression of the outer lead portions by thermocompression heads conventionally used can be omitted from the surface mounting procedure, and the present TCP and QFPs or the like can be collectively soldered by the reflow process.

The lead 104 having its joining portion 141 secured to the rear surface of the base 151 projects outward as bent to a circular-arc form as illustrated and therefore causes no trouble to inspection with the camera.

Figure 55:
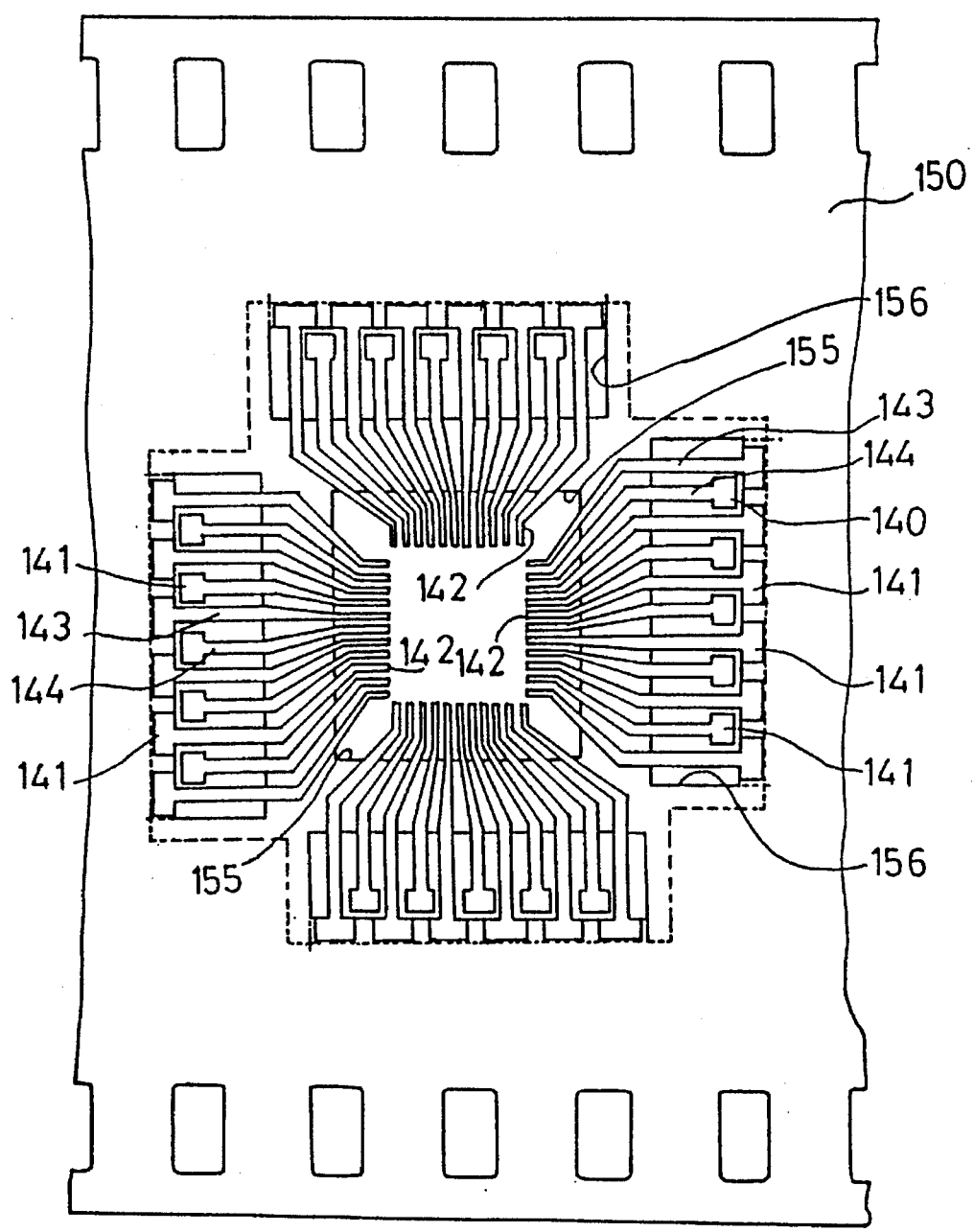
FIG. 55 is a plan view of a film carrier tape for use in producing the TCP.

FIG. 55 shows a film carrier tape 150 prepared in the production process of the TCP 103. The tape 150 is formed with an inner window 155 and four outer windows 156 around the inner window 155.

A lead pattern comprising inner lead portions 142 and first and second outer lead portions 143, 144 is formed on the film carrier tape 150 by etching a copper foil. The first outer lead portion 143, which provides each first lead described, extends across the outer window 156 and has an outer end extending to the outer edge of the outer outer window 156. The second outer lead portion 144, which provides the second lead described, terminates in the outer window 156. The outer lead portions 143, 144 have an increased width at their outer ends. The increased width portions are provided for use as test pads and to facilitate fixing with an adhesive tape or soldering.

An IC chip is mounted on the film carrier tape 150, followed by inner bonding and sealing with resin, and then by cutting along the broken lines in FIG. 55, whereby support film 105 is formed which comprises a base 151, frames 152 and arms 153 as shown in FIG. 52 to obtain a semifinished product of TCP.

Figure 56:
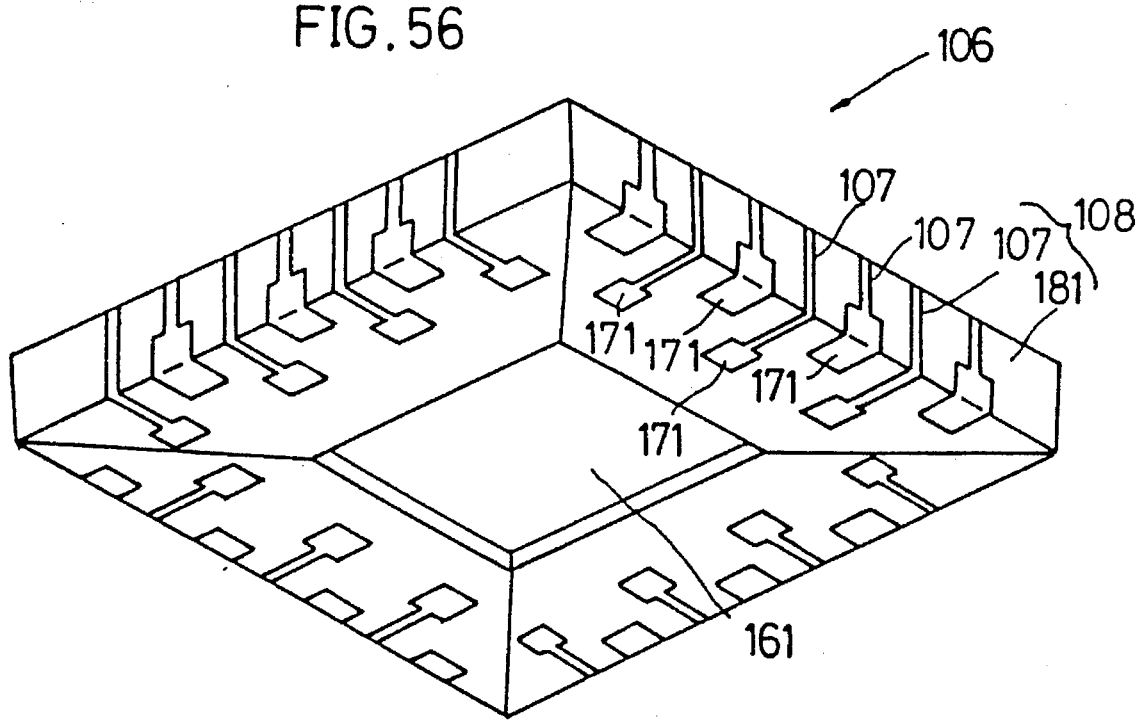
FIG. 56 is a perspective view showing the rear side of another surface mount component, i.e., a film lead package, embodying the invention.
Figure 57:
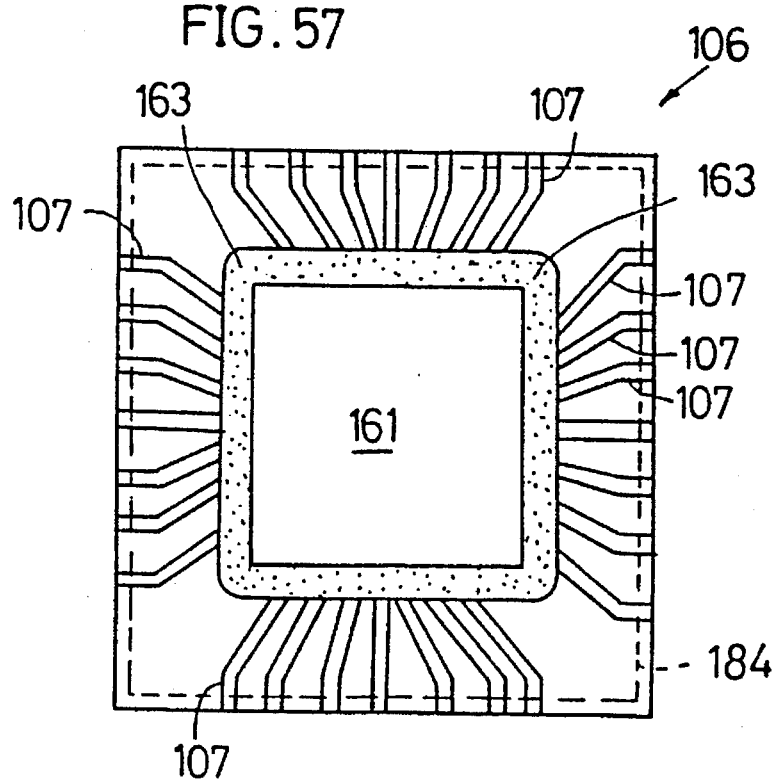
FIG. 57 is a plan view of the film lead package.
Figure 58:
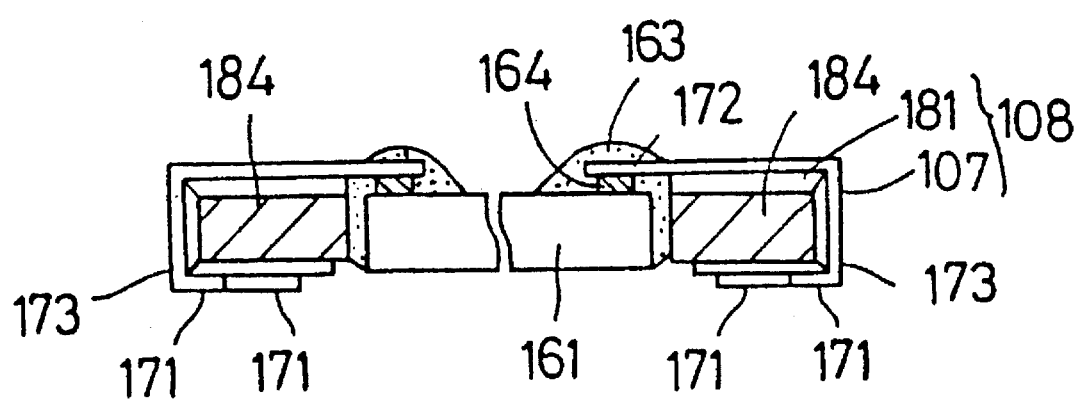
FIG. 58 is a sectional view of the film lead package.

FIGS. 56, 57 and 58 show a surface mount electronic component having a novel structure of IC package devised by the present inventor during the research which has matured to the present invention. Lead patterns 107 formed by etching a copper foil are provided on the outer surface of the body of package. This IC package will hereinafter be referred to as a film lead package 106.

The film lead package 106 comprises a substrate 184 having a central opening as shown in FIG. 58, with an IC chip 161 accommodated in the opening. The substrate 184 is wrapped with a lead film 108.

The lead film 108 comprises a base film 181. The plurality of lead patterns 107 extend outward in four directions and are formed over a surface of the film 181. Each of the lead pattern 107 has an inner lead portion 172 bonded to a bump 164 on the IC chip 161, and the bonded portion is sealed with resin 163.

The lead pattern 107 extends from the inner lead portion 172 outward along the surface of the substrate 184, and has an outer lead portion 173 extending from a side face of the substrate 184 to the rear surface thereof to provide a joining portion 171 of increased width at its outer end.

As shown in FIG. 56, the joining portions of the lead patterns 107 for a wiring board is such that the adjacent joining portions 171 are spaced apart with respect to the direction of arrangement of the leads and also longitudinally of the leads.

Figure 62:
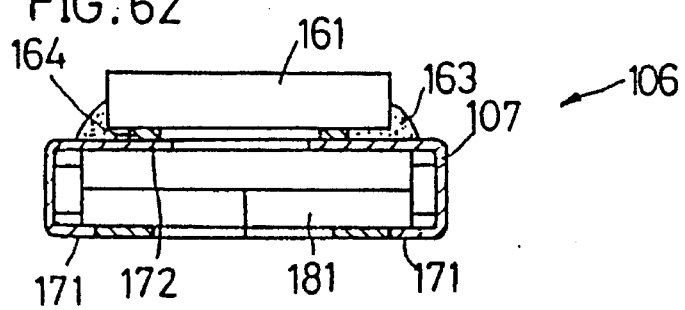
FIG. 62 is a sectional view of the film lead package as completed.
Figure 63:
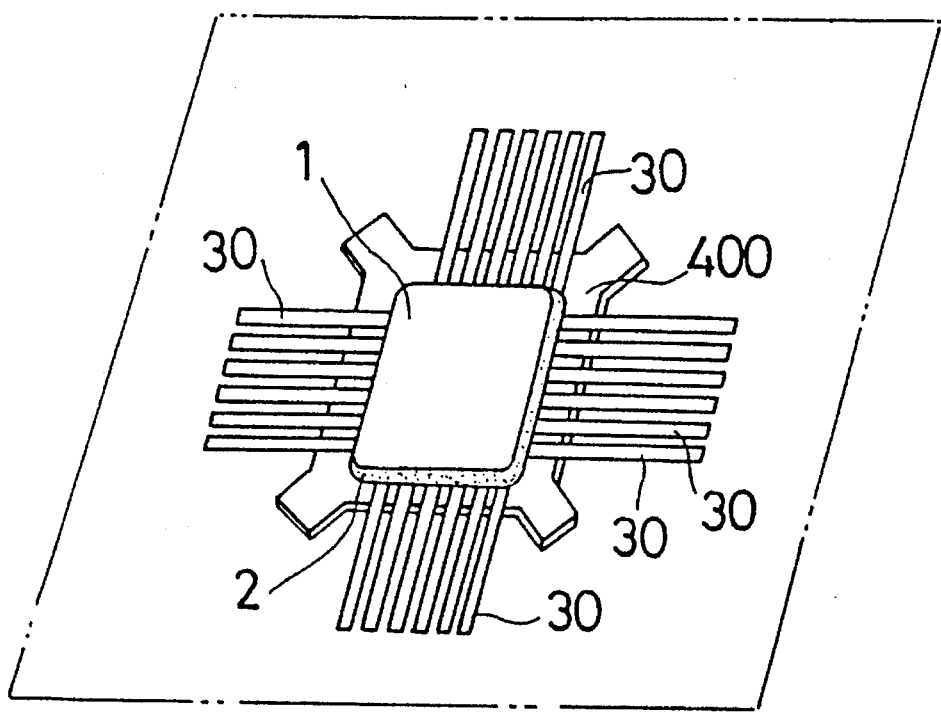
FIG. 63 is a perspective view of a conventional surface mount component.
Figure 64:
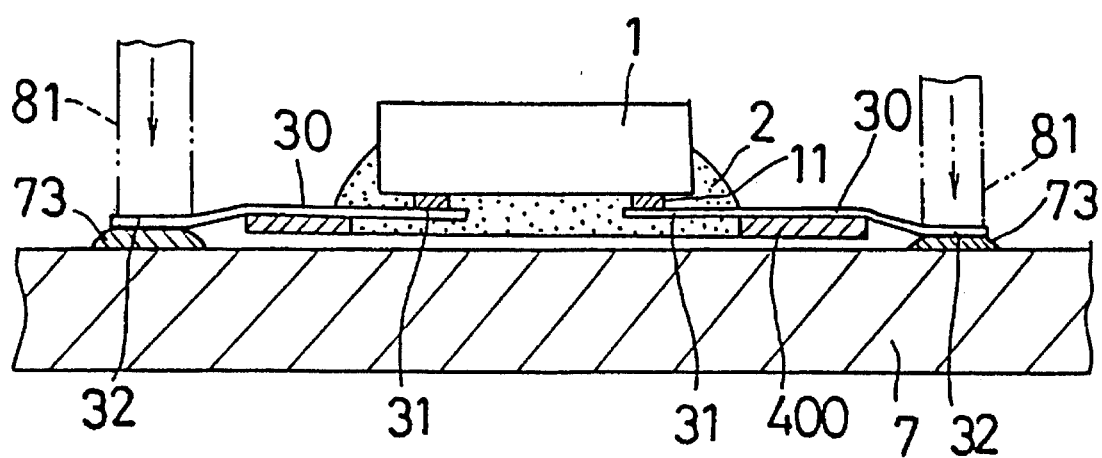
FIG. 64 is a sectional view showing a procedure for mounting the conventional component on the surface of a wiring board.

FIG. 62 shows another embodiment of film lead package 106.

With this package 106, an IC package 161 is mounted on the front surface of a film frame formed with lead patterns 107. The IC chip 161 is attached by bumps 164 to the inner lead portions 172 of the lead patterns 107.

Figure 60:
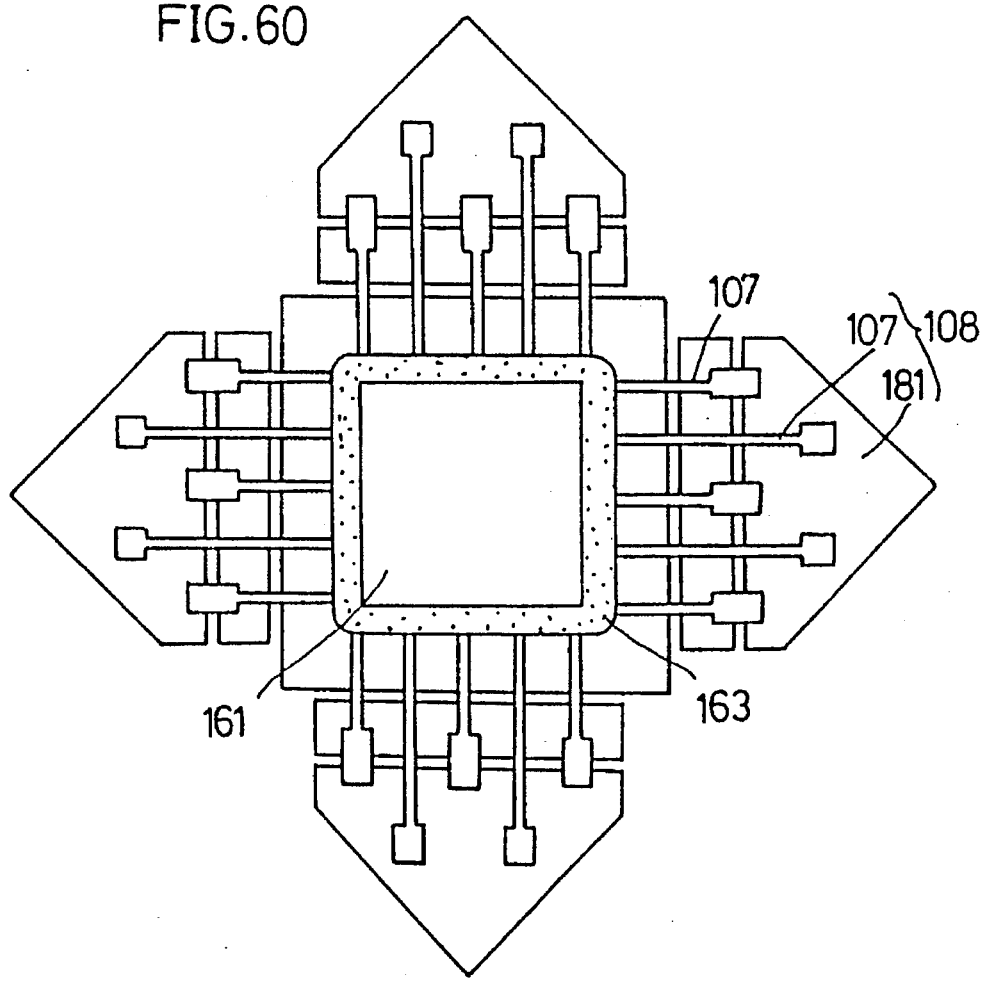
FIG. 60 is a plan view showing the second half of the production process.
Figure 61:
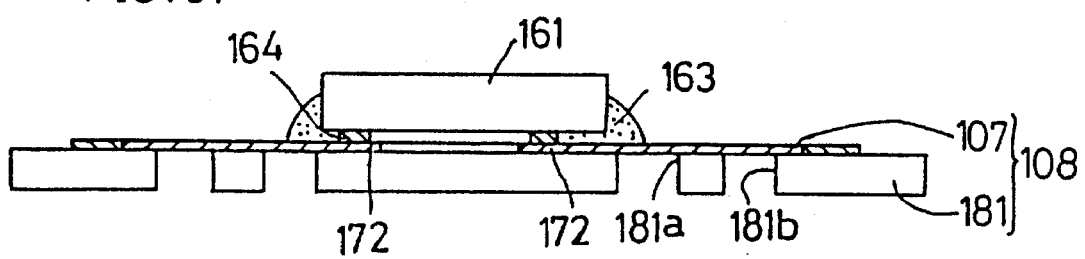
FIG. 61 is a sectional view of the same.

FIG. 56, (a) and (b) and FIGS. 60 and 61 show a process for producing the film lead package 106.

Figure 59A:
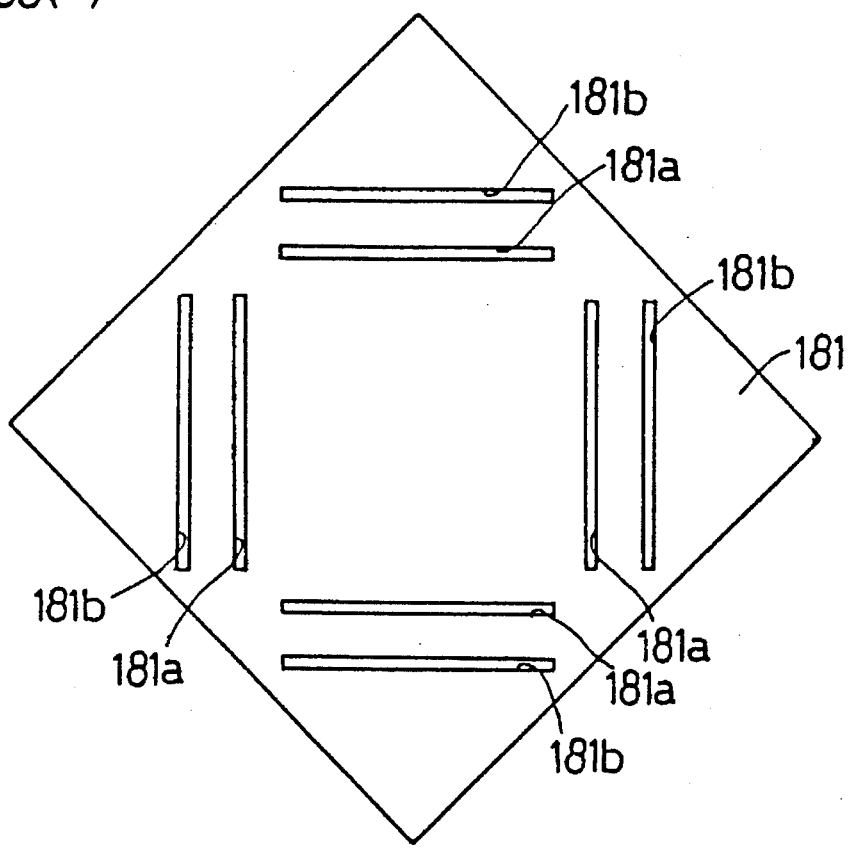
FIG. 59, (a) and (b) are plan views showing the first half of a process for producing a film lead package of different construction.
Figure 59B:
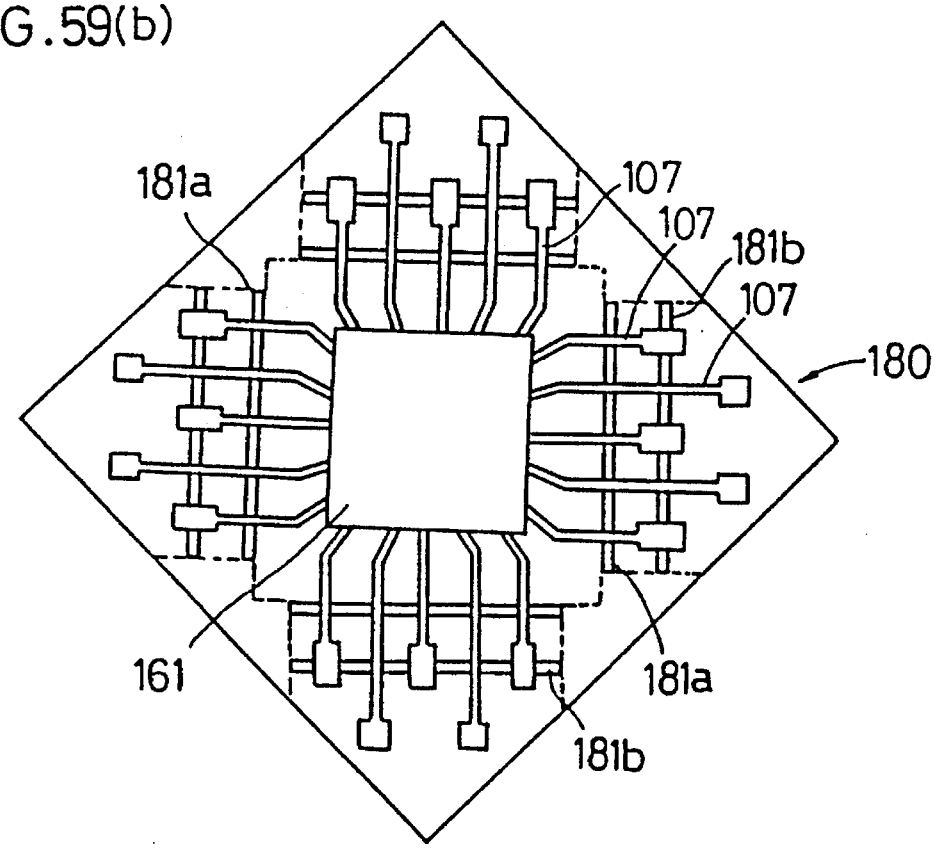

First, a base film 181 is prepared which is formed with a pair of slits 181a, 181b at each of four peripheral portions thereof as seen in FIG. 59, (a). FIG. 61 shows the slits 181a, 181b in section.

As seen in FIG. 59, (b), a plurality of lead patterns 107 which are alternately different in the length of outer lead portion are formed on the surface of the base film by etching. An IC chip 161 is mounted on the inner lead portions of the lead patterns 107 by means of bumps, and the lead portions are sealed with resin.

In this state, the IC chip 161 is tested for operation utilizing the enlarged end portions of the leads.

Next, the resulting composite package film 180 is cut along the broken lines of FIG. 59, (b) to obtain a lead film 108 shown in FIGS. 60 and 61.

Although peripheral portions of the base film are cut off by the cutting step, these portions are held connected by the lead patterns 107.

The lead film 108 is then folded as shown in FIG. 62, whereby the film lead package 106 of the present embodiment is completed.

In the case of the package 106, no objectionable force will be exerted on the lead patterns 107 by the folding from the state of FIG. 61 to the state of FIG. 62.

The slits 181a and 181b can be modified variously in sectional form. It is possible to form one of the slits with an increased width and to omit the other slit.

With the film leand packages 106 described, the lead patterns 107 can be accurately formed with a very small lead width and very small lead spacing (e.g. 40 micrometers) by etching, printing or plating.

In the case where the lead pitch is thus reduced, the base film 181 and the substrate 184 are prepared from the same material as the substrate of the wiring board. This renders stretching or contraction due to temperature variations uniform to preclude the solder joining portions from displacement.

Furthermore, the base film 181 and the substrate 184 may be made of a material which has the same coefficient of expansion as the IC chip (for example, glass, ceramics or the like). This serves to preclude displacement when the IC chip is mounted in place by means of bumps.

In construction, the film lead packages 106 are not limited to surface mount electronic components of the invention wherein the adjacent joining portions 171, 17 are displaced from each other longitudinally of the leads but are usable also for conventional common surface mount electronic components wherein the joining portions along the direction of arrangement of the leads are alinged.

The QFP comprising the foregoing lead frame, TCP comprising etched copper foil and film lead package can be combined into a surface mount electronic component of the invention.

With the embodiments shown in FIGS. 39 to 42 or FIGS. 52 to 62, the joining portions of the leads for the wiring board are so formed that the adjacent joining portions are spaced apart with respect to a direction orthogonal to the direction of arrangement of the leads. Accordingly, the width of leads can be set at a minimum value that will not cause clogging of the mask, with the lead spacing determined suitably, and yet solder bridging can be prevented, with the lead pitch reduced to not greater than 0.3 mm.

Since the solder joining portions of the leads are arranged at a spacing in the direction of arragement of leads without lapping, the solder joints can be completely checked for faults after the component has been mounted on the wiring board.

The above embodiments have been described to illustrate the present invention. The embodiments therefore should not be construed as limiting the scope of the invention as defined in the appended claims or reducing the scope thereof. The parts of the present components are not limited to those of the embodiments in construction but can of course be modified variously by one skilled in the art without departing from the spirit of the invention as defined in claims.

What is claimed is:

1. A surface mount component comprising a chip body having an integrated circuit incorporated therein, and a plurality of leads extending outward from the chip body, the surface mount component being comprising the chip body is disposed on a sheet of insulating film centrally thereof and integrally joined to the insulating film with a sealing resin, the insulating film being formed in an outer peripheral portion thereof with a plurality of windows around the chip body, the plurality of leads being bonded to one surface of the insulating film and extending on the film surface in four directions over the window, each of the leads being formed at a region thereof exposed from the window with an electrical connector portion to be joined to a wiring board, the electrical connector portion of each lead being bondable to the wiring board by an electroconductive bonding layer without separating off an outer peripheral edge of the insulating film having the outer end of the lead secured thereto.

2. A surface mount component as defined in claim 1 wherein the electrical connector portions of the leads adjacent to each other and exposed from the window each have an increased width as displaced from the other longitudinally of the leads.

3. A surface mount component as defined in claim 1 wherein the windows include two windows positioned close to the chip body and close to the periphery of the insulating film respectively and formed at each of a plurality of locations around the chip body, and the plurality of leads are secured to the insulating film on the surface thereof to be opposed to the wiring board and include a first group of leads extending from the chip body to the window close to the chip body through the shortest path and further extending over the same window, and a second group of leads extending from the chip body to the outer side of the window close to the film periphery through a bent path and further extending over the same window in a direction opposite to the first lead group.

4. A surface mount component as defined in claim 1 wherein the plurality of leads are secured to the wiring board, and the two electrical connector portions of the leads adjacent to each other with respect to time direction of arrangment of the leads are spaced part from each other longitudinally of the leads.

5. A surface mount component as defined in claim 1 wherein the insulating film is formed on the surface thereof to be opposed to the wiring board with a bonding pad at each of locations around the chip body and away from the leads.

6. A surface mount component comprising a chip body having an integrated circuit incorporated therein, and a plurality of leads extending outward from the chip body, the surface mount component being comprising the chip body is disposed on a sheet of insulating film centrally thereof and integrally joined to the insulating film with a sealing resin, the plurality of leads being bonded to one surface of the insulating film and extending on the film surface in four directions, each of the leads laving an outer end projecting outward beyond the insulating film and being fixedly joined at the projecting end to a frame member surrounding the chip body, the frame member being integrally connected to the insulating film, each of the leads being formed at a region thereof from the insulating film to the frame member with an electrical connector portion to be joined to a wiring board, the electrical connector portion of each lead being bondable to the wiring board by an electroconductive bonding layer without separating off the frame member when the component is mounted on a surface of the wiring board.

7. A surface mount component as defined in claim 6 wherein the insulating film is formed on the surface thereof to be opposed to the wiring board with a bonding pad at each of locations around the chip body and away from the leads.

8. A surface mount component comprising a chip body having an integrated circuit incorporated therein, and a plurality of leads extending outward from the chip body, the surface mount component being comprising the chip body is disposed on a sheet of insulating film centrally thereof and integrally joined to the insulating film with a sealing resin, the plurality of leads being bonded to one surface of the insulating film and extending on the film surface in four directions, each of the leads having an outer end projecting outward beyond the insulating film and being fixedly joined at the projecting end to one of insulating frames arranged around the chip body, the insulating frames being fixedly joined to the insulating film directly, each of the leads being formed at a region thereof from the insulating film to the insulating frame with an electrical connector portion to be joined to a wiring board, the electrical connector portion of each lead being bondable to the wiring board by an electroconductive bonding layer without separating off the insulating frame when the component is mounted on a surface of the wiring board.

9. A surface mount component as defined in claim 8 wherein the insulating film is formed on the surface thereof to be opposed to the wiring board with a bonding pad at each of locations around the chip body and away from the leads.

* * * * *